United States Patent US 12,268,033 B1
Sangaraju et al. (45) Date of Patent: Apr. 1, 2025

(54) SELF-POWERED ULTRAVIOLET PHOTODETECTION PERFORMANCE USING AU/TA2O5/GAN: METAL-INSULATOR-SEMICONDUCTOR (MIS) HETEROSTRUCTURE

(71) Applicant: United Arab Emirates University, Al Ain (AE)

(72) Inventors: Sambasivam Sangaraju, Al Ain (AE); Nanda Kumar Reddy Nallabala, Al Ain (AE)

(73) Assignee: UNITED ARAB EMIRATES UNIVERSITY, Al Ain (AE)

( * ) Notice: Subject to any disclaimer, the term of this patent is extended or adjusted under 35 U.S.C. 154(b) by 0 days.

(21) Appl. No.: 18/640,734

(22) Filed: Apr. 19, 2024

(51) Int. Cl.
*H10F 30/222* (2025.01)
*C23C 14/04* (2006.01)
*C23C 14/08* (2006.01)
*C23C 14/18* (2006.01)
*C23C 14/30* (2006.01)
*C23C 14/58* (2006.01)
*C30B 25/18* (2006.01)
*H10F 10/16* (2025.01)
(Continued)

(52) U.S. Cl.
CPC ......... *H10F 30/222* (2025.01); *C23C 14/042* (2013.01); *C23C 14/083* (2013.01); *C23C 14/18* (2013.01); *C23C 14/30* (2013.01); *C23C 14/5806* (2013.01); *C30B 25/183* (2013.01); *H10F 10/16* (2025.01); *H10F 71/128* (2025.01); *H10F 77/206* (2025.01)

(58) Field of Classification Search
CPC .......... H01L 31/109; H01L 31/022408; H01L 31/0336; H01L 31/1864
See application file for complete search history.

(56) References Cited

PUBLICATIONS

Nallabala, et al. "Enhanced self-driven ultraviolet photodetection performance of high-k Ta2O5/GaN heterostructure, Materials Science in Semiconductor Processing," vol. 170,2024, 107954, ISSN 1369-8001,https://doi.org/10.1016/j.mssp.2023.107954 (avaliable Nov. 2023) (Year: 2023).*

* cited by examiner

*Primary Examiner* — Matthew L Reames
(74) *Attorney, Agent, or Firm* — MH2 Technology Law Group, LLP

(57) ABSTRACT

There is disclosed an ultraviolet (UV) photo sensing element comprising a GaN substrate and a $Ta_2O_5$ thin film layer, forming a GaN (gallium-nitride) and $Ta_2O_5$ (tantalum pentoxide) based heterojunction wherein the formed heterojunction receives and converts UV light into electrical signals/in the photovoltaic mode (at 0 V) or in a self-driven mode. Also disclosed is a method of fabrication of an ultraviolet (UV) photodetector (PD) device, the method comprising growing silicon-doped n-type GaN epitaxial layers on a stack of un-doped GaN/sapphire samples, cleaning the GaN samples, pelletizing and depositing tantalum pentoxide ($Ta_2O_5$) powder on the n-type GaN samples, forming $Ta_2O_5$/GaN stacks, post-annealing the formed $Ta_2O_5$/GaN stacks; and depositing high purity Au on the $Ta_2O_5$/GaN stacks. The photodetector (PD) device is a heterojunction ultraviolet (UV) photodetector (PD) device.

14 Claims, 23 Drawing Sheets

(51) Int. Cl.
*H10F 71/00* (2025.01)
*H10F 77/20* (2025.01)

SELF-POWERED ULTRAVIOLET PHOTODETECTION PERFORMANCE USING AU/TA2O5/GAN: METAL-INSULATOR-SEMICONDUCTOR (MIS) HETEROSTRUCTURE

FIELD OF THE INVENTION

The present invention relates to the field of ultraviolet photodetection, and more particularly to a self-powered ultraviolet photodetection (UV-PD) device comprising a GaN (gallium-nitride) and $Ta_2O_5$ (Tantalum pentoxide) based heterojunction.

BACKGROUND OF THE INVENTION

Background description includes information that may be useful in understanding the present invention. It is not an admission that any of the information provided herein is prior art or relevant to the presently claimed invention, or that any publication specifically or implicitly referenced is prior art.

Ultraviolet (UV) radiation emitted by sunlight varies in the wavelength range of 200-400 nm. This radiation is divided into UV-A (320-400 nm), UV-B (280-320 nm) and UV-C (200-280 nm). Almost all the UV-A radiation is not absorbed by the ozone layer and reaches the earth's surface. This leads to health problems such as ageing, skin cancer and DNA damage when living organisms are exposed for long periods of time. Therefore, it is crucial to seek new effective methods to detect UV-A radiation. At present, ultraviolet photodetection (UV-PD) devices have attracted considerable attention in the optoelectronic field such as ozone layer monitoring, water purification, space communications, flame/missile detection, industrial monitoring, biological sensing, and UV astronomy, etc.

Several research groups have used different interfacial layers such as $CeO_2$, $Pr_2O_3$, $Si_3N_4/Al_2O_3$, $Bi_2Se_3$, $Ga_2O_3$, $La_2O_3$, $HfO_2$ and $Ta_2O_5$ to study their influence on the electronic parameters of the formed heterojunction for use in microelectronic devices. Among these, $Ta_2O_5$ is one of the emerging high-k dielectric oxides used in optoelectronic fields due to its high dielectric constant (~22), permittivity, refractive index, excellent environmental stability and wide bandgap. In microelectronic device applications, ultrathin $Ta_2O_5$ film has replaced the conventional $SiO_2$ film due to its higher dielectric constant value. In addition, $Ta_2O_5$ material has found practical applications such as capacitors, anti-reflection layers, memory devices and UV PDs, etc. Based on literature analysis—some reports refer only to the basic structural, electrical and optical parameters of the $Ta_2O_5$ material-based heterojunction devices.

Based on the above explained, there exists a need for a better semiconducting material/heterostructure to utilize in UV photodetection applications, which overcomes the drawbacks of the traditionally employed materials/layers.

SUMMARY OF THE INVENTION

Therefore it is an object of the present invention to propose a self-powered ultraviolet photodetection (UV-PD) device comprising a GaN (gallium-nitride) and $Ta_2O_5$ (Tantalum pentoxide) based heterojunction.

There is disclosed a method of fabrication of an ultraviolet (UV) photodetector (PD) device, the method comprising growing silicon-doped GaN epitaxial layers on a stack of un-doped GaN samples, cleaning the GaN samples in trichloroethylene, acetone, methanol and boiling aqua regia [$HNO_3$:HCL] to remove the surface oxides and rinsed in deionized (DI) water, pelletizing the Tantalum pentoxide ($Ta_2O_5$) powder and depositing on the n-GaN samples, forming $Ta_2O_5$/GaN stacks, post-annealing the formed $Ta_2O_5$/GaN stacks; and depositing high purity Au on the $Ta_2O_5$/GaN stacks. The photodetector (PD) device is a heterojunction type ultraviolet (UV) photodetector (PD) device.

In an embodiment of the present invention, the Si-doped GaN epitaxial layers comprise 4.5 μm thickness.

In another embodiment of the present invention, growing the Si-doped GaN epitaxial layers on the stack of un-doped GaN samples is done via metal organic chemical vapor deposition (MOCVD) technique.

In another embodiment of the present invention, the Si-doped n-type GaN samples are loaded into an electron beam evaporation system after the cleaning steps.

In another embodiment of the present invention, the Tantalum pentoxide ($Ta_2O_5$) powder comprises a purity of 99%.

In another embodiment of the present invention, deposition of the Tantalum pentoxide ($Ta_2O_5$) powder on the n-GaN samples is done with 45 nm thickness.

In another embodiment of the present invention, post-annealing the formed $Ta_2O_5$/GaN stacks is done from 600° C. to 900° C. for 1 hour in air.

In another embodiment of the present invention, wherein 50 nm of high purity Au is deposited on the $Ta_2O_5$/GaN stacks using a photolithography interdigitated mask with an area of 6 $mm^2$.

In another embodiment of the present invention, the method further comprises evaluating deposited Au and $Ta_2O_5$ materials thickness using quartz crystal microbalance.

In another embodiment of the present invention, the method further comprises using neutral density (ND) filters for reducing transmittance/power of illuminated light to ensure superior photosensitivity of the annealed ultraviolet (UV) photodetector (PD) device.

In another embodiment of the present invention, root-mean-square (rms) roughness values for as-deposited, 700° C. and 800° C. $Ta_2O_5$ thin films deposited on GaN substrate are 2.19 nm, 4.87 nm and 42.8 nm, respectively.

In an embodiment of the present invention, the photodetector (PD) device is an Au/$Ta_2O_5$/GaN ultraviolet (UV) photodetector (PD) device.

In an embodiment of the present invention, the photodetector (PD) device is a heterojunction ultraviolet (UV) photodetector (PD) device.

In an embodiment of the present invention, the Au/$Ta_2O_5$/GaN UV PD device operates at 0 volts (photovoltaic mode).

As another aspect of the present invention is disclosed an ultraviolet (UV) photosensing element comprising a GaN substrate and a $Ta_2O_5$ thin film layer, forming a GaN (gallium-nitride) and $Ta_2O_5$ (Tantalum pentoxide) based heterojunction wherein the formed heterojunction receives and converts UV light into electrical signals/in the photovoltaic mode (at 0V) or in a self-driven mode.

In an embodiment of the present invention, symmetric Au-interdigitated electrodes are formed on the GaN (gallium-nitride) and $Ta_2O_5$ (Tantalum pentoxide) based heterojunction for collecting a photovoltaic output.

In another embodiment of the present invention, the UV light is in the range of 210-380 nm.

In another embodiment of the present invention, the UV photo sensing element is a single post-annealed Au/$Ta_2O_5$/GaN device.

In another embodiment of the present invention, the photodetection limit is tuned from UV-A (320-400 nm) to UV-C (200-280 nm) regions using the single post-annealed Au/Ta$_2$O$_5$/GaN device.

In an embodiment of the present invention, the proposed element is Al$_2$O$_3$/undoped-GaN/Si-doped GaN heterostructure (sapphire/undoped GaN buffer layer/n-GaN/Ta$_2$O$_5$/Au heterojunction) in which Si-doped n-GaN functions as UV light sensing material and undoped GaN as a buffer layer between Si-doped GaN and Al$_2$O$_3$.

BRIEF DESCRIPTION OF THE DRAWINGS

The subject matter that is regarded as the invention is particularly pointed out and distinctly claimed in the claims at the conclusion of the specification. The foregoing and other aspects, features, and advantages of the invention are apparent from the following detailed description taken in conjunction with the accompanying drawings in which:

(FIG. 6C) 800° C. Au/Ta$_2$O$_5$/n-GaN PD devices up to ±10 V bias.

(FIGS. 8A and 8B) and 800° C. (FIGS. 8C and 8D) post-annealed Au/Ta$_2$O$_5$/n-GaN PD devices up to ±10 V bias using ND-1 and ND-2 filters.

(FIG. 10B) and 800° C. (FIG. 10C) post-annealed Au/Ta$_2$O$_5$/n-GaN PD devices and the corresponding growth/decay time fittings made using equations 5 and 6 for the as-deposited (FIG. 10D), 700° C. (FIG. 10E) and 800° C. (FIG. 10F) post-annealed Au/Ta$_2$O$_5$/n-GaN PD devices.

DETAILED DESCRIPTION OF THE INVENTION

Figure 1A:
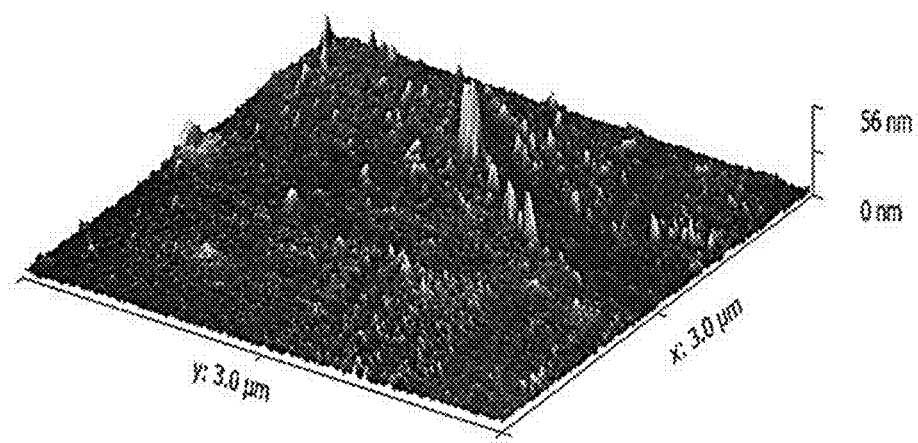
FIGS. 1A-1C show 3D top view surface morphology images for as-deposited, 700° C. and 800° C. annealed Ta$_2$O$_5$ films on GaN, respectively.

The aspects of the proposed self-powered ultraviolet photodetection (UV-PD) device comprising a GaN (gallium-nitride) and Ta$_2$O$_5$ (Tantalum pentoxide) based heterojunction—according to the present invention will be described in conjunction with FIGS. 1A-12D. In the Detailed Description, reference is made to the accompanying figures, which form a part hereof, and which is shown by way of illustration specific embodiments by which the invention may be practiced. It is to be understood that other embodiments may be utilized and logical changes may be made without departing from the scope of the present invention. The following detailed description, therefore, is not to be taken in a limiting sense, and the scope of the present invention is defined by the appended claims.

Semiconductors that possess wide bandgaps (WBGs) for example GaN, SiC, ZnO and AlN are largely utilized during the fabrication of optoelectronic, high frequency and high-power electronic devices. Among these Gallium nitrides (GaN) WBG semiconducting material has attracted a lot of consideration owing to its versatility along with stability to function in harsh environments/radiations. Further, GaN possess outstanding electrical properties for instance high carrier mobility, saturation velocity, breakdown voltage, chemical inertness along with the high temperature sustainability. And these factors are favouring GaN material to utilize in UV photodetection applications. Numerous researchers have fabricated and reported GaN based UV PDs in metal-semiconductor-metal (MSM) UV PDs configuration. GaN based MSM UV PDs fabrication steps are simple but suffers from abnormal leakage currents, lower responsivities and higher rise/fall times owing to the lattice mismatch arose between GaN material and sapphire. This fact generates a higher density of threading dislocations leading to larger leakage currents. Hence, realization of a higher value of Schottky barrier height (SBH) at metal and GaN interface reduces the magnitude of the attained leakage current with a superior photo to dark current ratios. This could be accomplished by introducing an insulating oxide material at metal/GaN interface and/or GaN buffer layer at the interface of GaN/sapphire.

The present invention relates to ultraviolet photodetectors (UV-PDs) exclusively using GaN and high-k dielectric. Consequently, the influence of post-annealing mechanism on structural/photodetection characteristic parameters of Au/Ta$_2$O$_5$/GaN: metal-insulator-semiconductor (MIS) heterojunction UV PD devices is discussed and are interpreted at 0 V. Further, at an external bias of 3 V, the fabricated Au/Ta$_2$O$_5$/GaN MIS PD devices are noticed to function near by the band edge of GaN (UV-A region) even if the illuminated light power (μW) was reduced using neutral density (ND) attenuator filters such as ND-1 (~10% of transmission) and ND-2 (~1% of transmission).

In accordance with the present invention, a broadband photodetector used to sense ultraviolet optical signals is disclosed comprising a GaN (gallium-nitride) and $Ta_2O_5$ (Tantalum pentoxide) based heterojunction. Recently, high-k dielectric oxide-based MIS type ultraviolet (UV) photodetectors (PDs) have engrossed researchers in the area of optoelectronics owing to their superior properties. Despite these outstanding characteristics, the practical application of PDs is hindered by their relatively lower responsivities. To address this issue and make the PD devices for commercial applications, the current invention focuses on the preparation of symmetric interdigitated Au electrodes on $Ta_2O_5$/GaN heterojunction and to check its functioning as a photosensor in UV-C to A region. The impact of post-annealing procedure on the bandgap, crystalline quality, surface morphology and chemical composition is then investigated using ultraviolet-visible spectrophotometry (UV-VIS), X-ray diffraction (XRD), Atomic force microscopy (AFM) and X-ray photoelectron spectroscopy (XPS) techniques, respectively. Photodetection parameters of the fabricated Au/$Ta_2O_5$/GaN MIS broadband (BB) PDs are studied using I-V, responsivity and temporal responses as a function of the post-annealing process.

In an embodiment of the present invention, 700° C. and 800° C. post-annealed Au/$Ta_2O_5$/GaN heterostructure PD device demonstrates improved photoresponsivity, external quantum efficiency (EQE) and rise/fall times compared with the as-deposited PD device. This remarkable improvement in the photodetection performance is attributed to the best band configuration of the $Ta_2O_5$/GaN heterostructure owing to its substantial post-annealing process and facilitating BB absorption from UV-C to A region with quicker generation, separation and transportation of photogenerated charge carriers using a single device.

The fabricated Au/$Ta_2O_5$/GaN ultraviolet (UV) photodetector (PD) device in accordance with the present invention exhibits an advantage of being operated in self-driven mode that is at zero volts (without external bias), and several others such as:

The photodetection limit is tuned from UV-A (320-400 nm) to UV-C (200-280 nm) regions using $Ta_2O_5$ absorbing thin film at the interface of Au/GaN interface.

At 0 V bias, with the illumination of 310 nm UV light, the 800° C. post-annealed MIS PD device exhibits peak responsivity of 212 mA/W, external quantum efficiency (EQE) of 86.8% and detectivity of $1.5 \times 10^{13}$ Jones.

Under self-driven mode (@0V) with 350 nm light illumination, the 800° C. post-annealed UV PD device generates faster rise and fall times of 90 ms and 790 ms, respectively.

In the UV regime, the attained average transmittance values of the annealed films exceeding 99.6% beyond 300 nm indicates the admirable UV light transmission through $Ta_2O_5$ films and reaching the underlying GaN semiconductor.

The fabricated UV PD devices are directly probed using tungsten needles which are interfaced with Keithley source meter. No silver paste/binder/copper wires are employed to connect the fabricated UV PD device with the photodetection set up.

The present invention emphasizes the significance of the combination of UV-C sensing $Ta_2O_5$ high-k oxide and UV-A sensing n-GaN materials to serve the future necessities of the photodetection technology under self-driven mode i.e., without any external bias.

Generally, conventional UV PDs operate at room temperature conditions. Thus, UV PDs functioning in high temperature conditions are fundamental optoelectronic components to support the innovative technological advancement. In this aspect the proposed post-annealed (700° C. and 800° C.) GaN based MIS type UV PD devices offer higher thermal stability as well as superior photodetection properties.

Further, to ensure the superior photosensitivity of the annealed UV PD devices, the transmittance/optical power of the illuminated UV light is reduced using neutral density filters ND1 and ND2. The fabricated post-annealed PD devices respond at 3 V external bias and exhibited reasonable responsivity/response times.

In an embodiment, an alternative and cost-effective electron beam evaporation method is recommended to grow the desired crystalline $Ta_2O_5$ thin films at the Au/GaN interface compared to other physical vapor deposition approaches such as pulsed laser deposition (PLD) and atomic layer deposition (ALD) to fit the future necessities of optoelectronic field. In the UV-A regime, the average transmittance value of >98% is attained for the post-annealed $Ta_2O_5$ films.

In accordance with a primary embodiment of the present invention, a method of fabrication of Au/$Ta_2O_5$/GaN ultraviolet (UV) photodetector (PD) device is proposed.

Considering fabrication of the proposed Au/$Ta_2O_5$/GaN MIS heterojunction UV PD device and employed photodetection measurement setup, in accordance with the proposed invention, Si doped GaN epitaxial layers of 4.5 μm thickness are grown on a stack of un-doped GaN buffer layer (~50 nm)/sapphire (0001) employing the metal organic chemical vapor deposition (MOCVD) technique. At room temperature, the calculated dislocation density of the n-GaN films was $<5 \times 10^8$ cm$^{-2}$ and carrier concentration is approximately $\sim 2-4 \times 10^{17}$ cm$^{-3}$. Prior to the deposition of $Ta_2O_5$ films onto n-GaN, a cleaning procedure is followed. After the cleaning steps, the n-GaN samples are immersed in de-ionized water and blown with $N_2$ gas. The samples are loaded into an electron beam evaporation system. Tantalum pentoxide ($Ta_2O_5$) powder with a purity of 99% is pelletized and deposited on the n-GaN samples with 45 nm thickness. The $Ta_2O_5$/GaN stacks are post-annealed from 600° C. to 900° C. for one hour in air (@5° C./min). Then, high purity Au (50 nm) is deposited onto the $Ta_2O_5$/GaN stack using photolithography interdigitated mask with an area of 6 mm$^2$. The interdigitated electrodes (IDE) of width 198.6 μm and spacing is 198.8 μm are obtained using the photolithography mask. The deposited Au and $Ta_2O_5$ materials thickness is evaluated using quartz crystal microbalance. To ensure the superior photosensitivity of the annealed UV PD devices, the transmittance of the illuminated light is reduced using neutral density filters. Considering the material characterizations—$Ta_2O_5$/quartz and $Ta_2O_5$/GaN samples are separately prepared for the estimation of optical bandgap, chemical composition, morphology and structural analysis with a UV-VIS Spectrophotometer, XPS, AFM and X-ray Diffraction, respectively.

The most noticeable benefits of the present invention include operation of the UV PD device at zero bias with incident optical powers in the order of μW, a stable operation at high temperatures (700-800° C.), remarkable stability even for four continuous ON/OFF cycles of UV light, cost-effective deposition approach compared to ALD and PLD preferable for large areas, single post-annealed UV PD device responses in the broad spectral range of 210 nm-380 nm and reasonable photosensitivity/response times of the annealed UV PD devices (the optical powers were reduced using neutral density filters at 3 V).

Figure 1B:
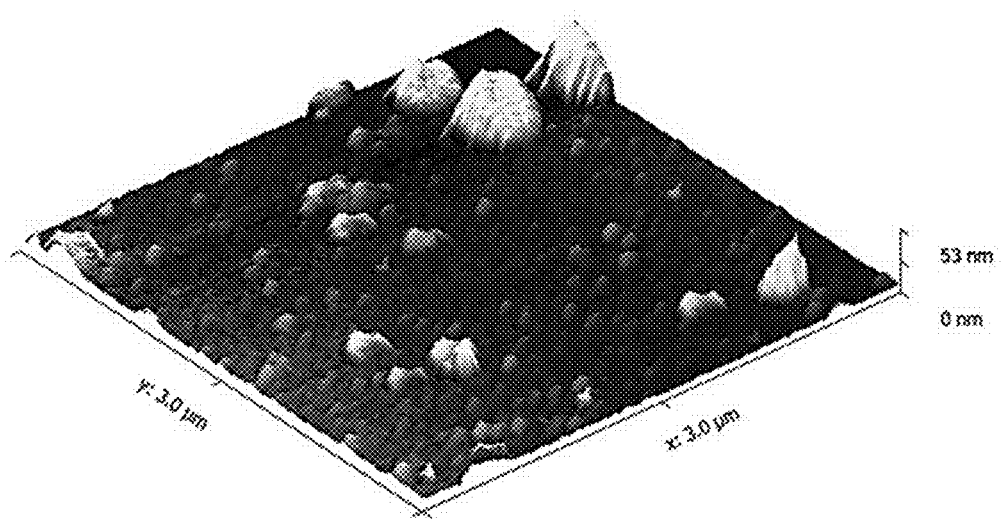
Figure 1C:
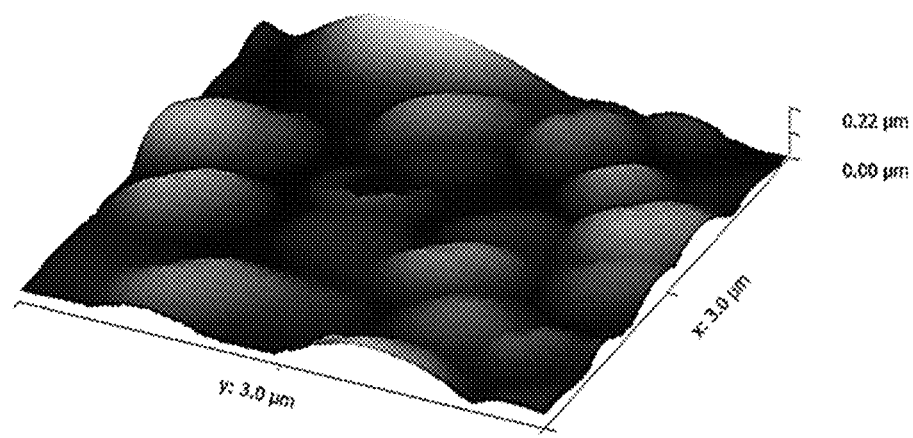
Figure 2:
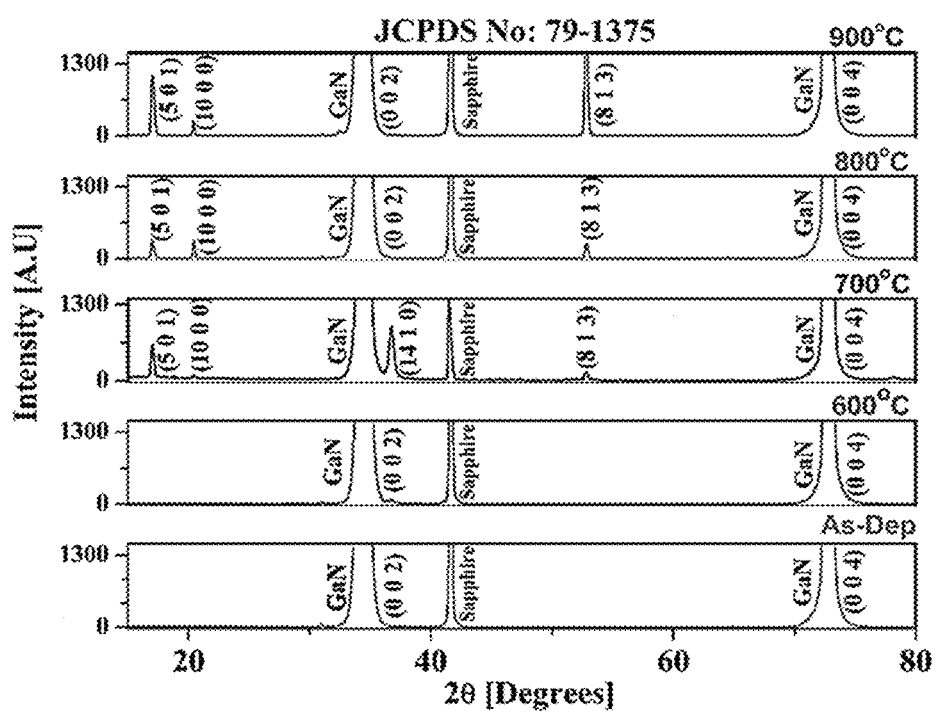
FIG. 2 graphically shows the X-ray diffraction spectrum for the as-deposited and post-annealed Ta$_2$O$_5$ films deposited on GaN.

Considering the results on evaluation of structural parameters of Ta$_2$O$_5$/GaN and Ta$_2$O$_5$/Quartz stack as a function of post-annealing process, FIGS. 1A-1C show 3D top view surface morphology images for as-deposited, 700° C. and 800° C. annealed Ta$_2$O$_5$ films on GaN, respectively. Surface topography of thin films usually influences the structural and electronic parameters of the fabricated photodetection devices. Further, topography finds a significant task in describing the functioning of photo sensing devices in real-time applications. Thus, surface morphologies of the formed Ta$_2$O$_5$ thin films with and without post annealing process are examined using AFM in non-contact mode, as displayed in FIGS. 1A-1C. The 3D topographic microstructural representation of the Ta$_2$O$_5$ thin films is presented in FIGS. 1A-1C.

The root-mean-square (rms) roughness values for the as-deposited, 700° C. and 800° C. Ta$_2$O$_5$ thin films deposited on GaN substrate are found to be 2.19 nm, 4.87 nm and 42.8 nm, respectively. From FIGS. 1A-1C, the grains/clusters size of the prepared Ta$_2$O$_5$ films increases with increasing post-annealing temperature. The as-deposited and 700° C. post annealed Ta$_2$O$_5$ film surface is noticed to possess clusters in agglomeration state. Further, the Ta$_2$O$_5$ film post-annealed at 800° C. observed to compose clusters of spherical shape islands with an average height of ~0.14 μm, separation of ~0.57 μm and width of ~0.68 μm (from the height profiles, not shown here). Thus, these topographical AFM images reveal the formation of crystallinity at post-annealing treatment of 800° C. and are consistent with the XRD data.

The impact of the post-annealing process on the crystallinity of the prepared Ta$_2$O$_5$ thin films is characterized using XRD method in the range 2θ=20° to 80°. The XRD scans of the Ta$_2$O$_5$/GaN stacks performed at room temperature are presented in FIG. 2. These XRD results indicated that the as-deposited and 600° C. annealed films are amorphous. In contrast, the improvement in the crystallinity is noticed after the post-annealing temperatures ranging from 700° C. to 900° C. As displayed in FIG. 2, there are no Ta$_2$O$_5$ peaks noticed in the as-deposited/600° C. samples except for the GaN peaks at 34.4° and 72.5° with the orientations of (002) and (004), respectively. In all the XRD scans, the peak observed at 41.3° with an orientation of (0001) is allotted to sapphire. In the 700° C. XRD spectrum, the Ta$_2$O$_5$ peak noticed at 36.7° is assigned to the orientation (14 1 0) and is noticed to disappear in the 800/900° C. post-annealed XRD spectrum. As evidenced from FIG. 2, the Ta$_2$O$_5$ characteristic peaks are noticed at 17.3°, 20.2° and 52.7° with the orientations of (5 0 1), (10 0 0) and (8 1 3), respectively. Further, an improvement is noticed in the crystallinity for the obtained Ta$_2$O$_5$ films from 700° C. to 900° C. post-annealing temperatures.

Figure 3A:
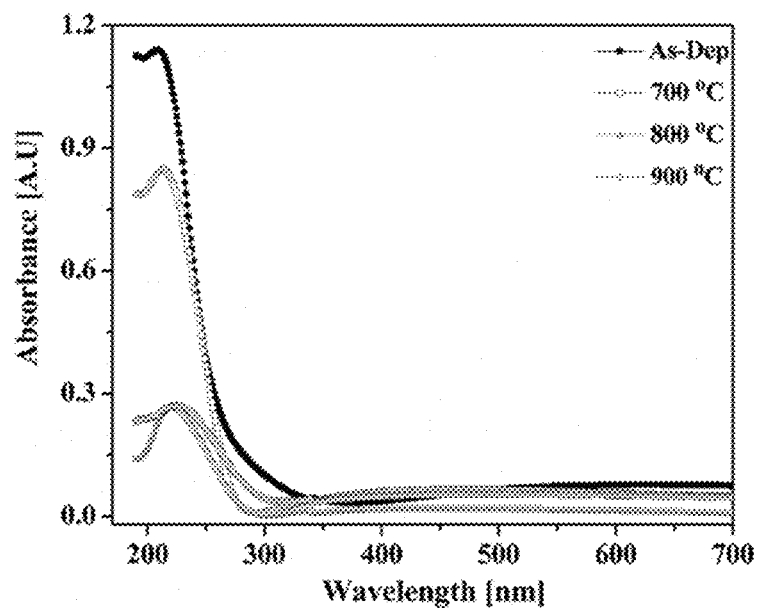
FIG. 3A shows absorption versus wavelength plots.

FIG. 3A shows absorption versus wavelength plots. FIGS. 3B-3E show Tauc's plots (fitted using the absorption data of FIG. 3A), and FIG. 3F graphically shows transmittance versus wavelength plots measured from the as-deposited, 700° C., 800° C. and 900° C. post-annealed Ta$_2$O$_5$ films deposited on quartz.

Figure 3B:
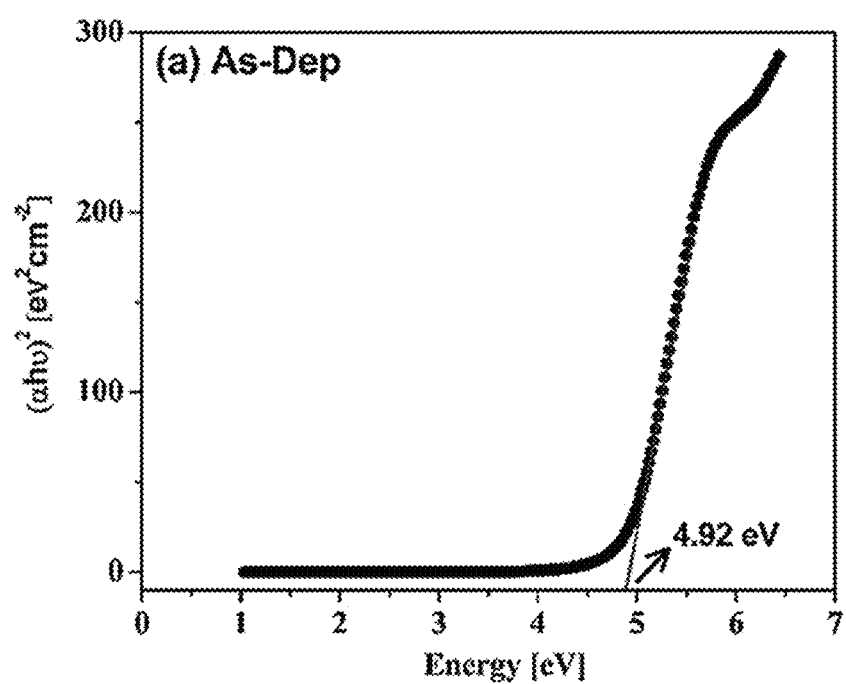
FIGS. 3B-3E show Tauc's plots (fitted using the absorption data of FIG. 3A), and FIG. 3F graphically shows transmittance versus wavelength plots measured from the as-deposited, 700° C., 800° C. and 900° C. post-annealed Ta$_2$O$_5$ films deposited on quartz.
Figure 3C:
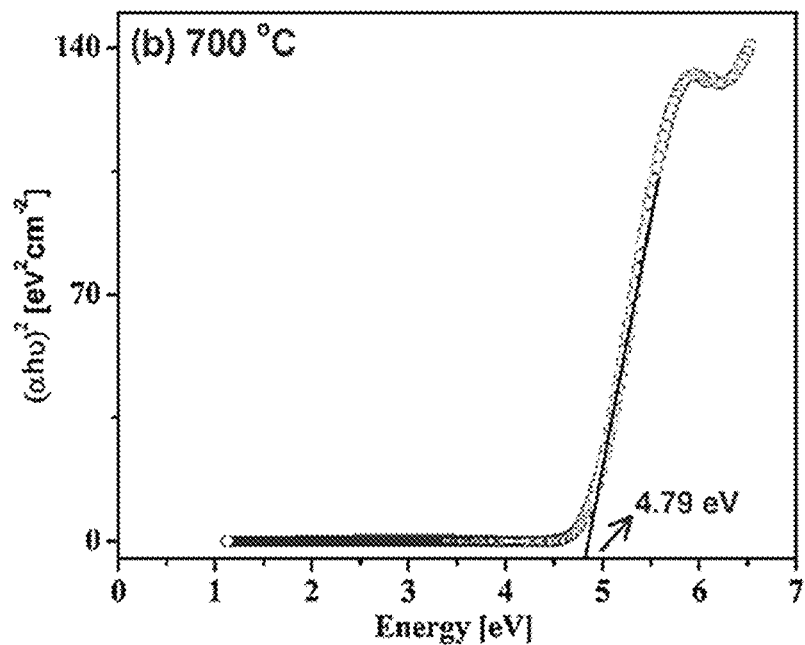
Figure 3D:
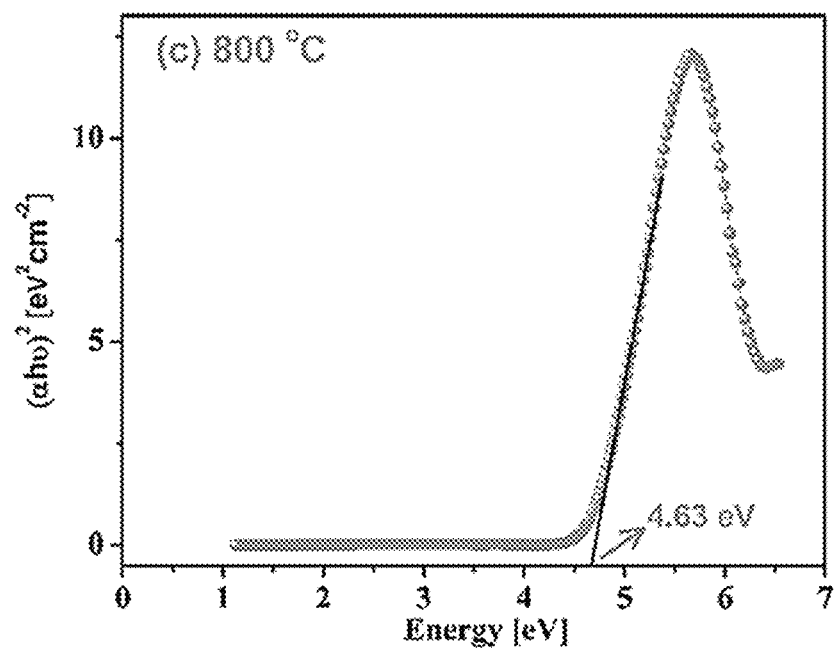
Figure 3E:
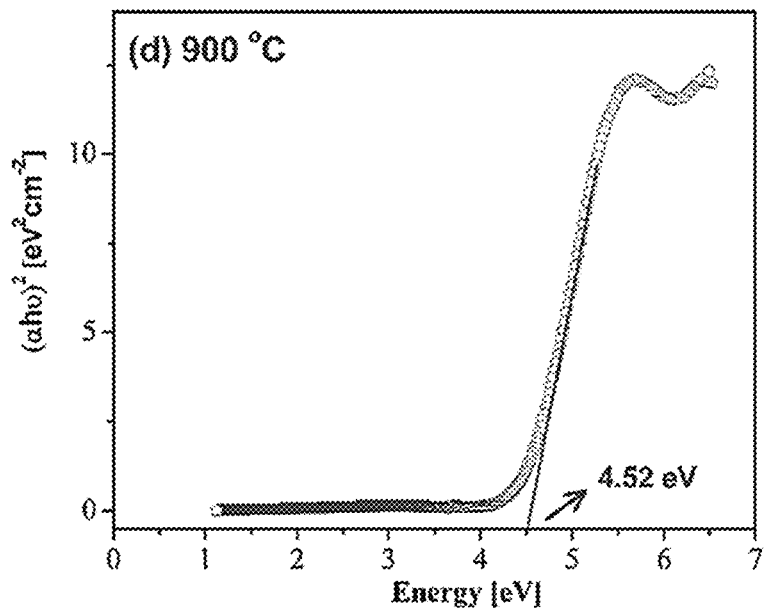
Figure 3F:
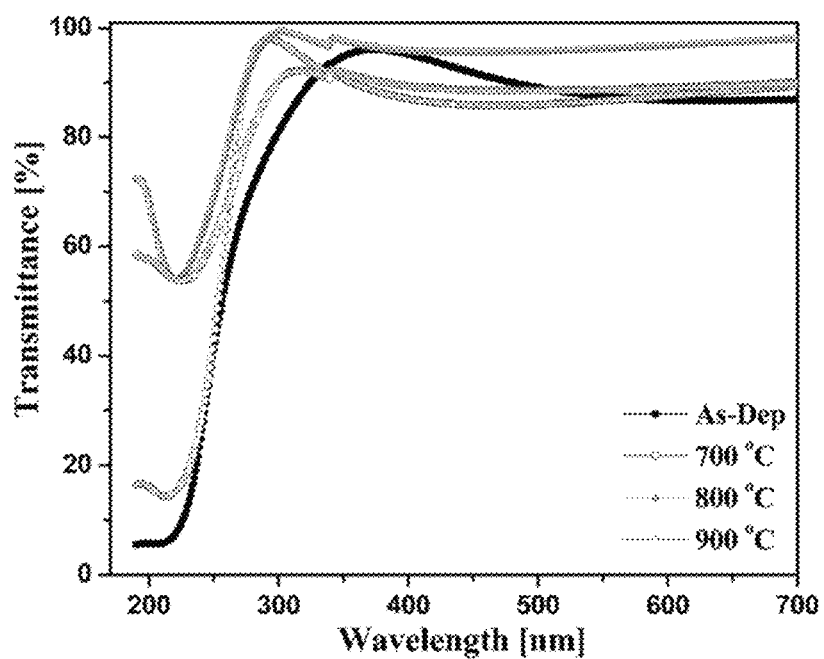

In order to find the bandgap (E$_g$) values within the Ta$_2$O$_5$ material, ultraviolet-visible (UV-VIS) spectroscopy technique is adopted. FIG. 3A exhibits the UV-VIS absorption spectra (190-700 nm) attained from the Ta$_2$O$_5$ films deposited on quartz glass. As evident from FIG. 3A, the Ta$_2$O$_5$ film absorption is maximum in the UV-C region (200-280 nm). After 280 nm, a substantial reduction in absorbance is noticed up to 700 nm. Further, the observed absorbance peak intensities are noted to decrease with the increase in post-annealing temperatures. However, almost comparable absorbance was noticed in the case of 800 and 900° C. post-annealed films. The bandgaps (E$_g$) of Ta$_2$O$_5$ films are calculated using Tauc's plot (FIG. 3B). FIGS. 3B-3E display the Tauc's plot fitted utilizing the absorption data (FIG. 3A). The linear portion of the experimental (αhν)$^2$ dasta is extrapolated to X-axis by means of the equation 1:

$$\alpha h\nu = E_D(h\nu - E_g)^{1/2} \qquad (1)$$

where a is coefficient of absorption, E$_D$ is a constant and hν is energy of incident photons. From Tauc's plot, the estimated direct bandgaps (E$_g$) for the as-deposited, 700° C., 800° C. and 900° C. Ta$_2$O$_5$ films are evaluated as 4.92, 4.79, 4.63 and 4.52 eV, respectively. These values reveals that the increment of post annealing temperature has a dramatic impact on the attained bandgap values. These evaluated E$_g$ values are consistent with the earlier reported values of 4.41-4.64 eV in the case of RF magnetron sputtering. When the Ta$_2$O$_5$ films were subjected to post-annealing temperature of 700° C. and above the energy gap values are noticed to decrease from 4.92 eV to 4.52 eV. The possible reasons for this fact may be attributed to the reorientation of the atoms in the Ta$_2$O$_5$ crystal lattice caused by the amorphous to polycrystalline phase transition and improved crystallinity. Further, the extracted transmittance versus wavelength spectral data from the Ta$_2$O$_5$ films deposited on quartz at distinct post-annealing temperatures are presented in FIG. 3F. In the UV-B & A regime, the calculated transmittance values of Ta$_2$O$_5$ films are found to increase with the post-annealing temperature. At ~300 nm, transmittance values are calculated as 83%, 98.7%, 99.6% and 91.4% for the as-deposited, 700° C., 800° C. and 900° C. post-annealed films, respectively. These results demonstrates that the average transmittance values of the annealed films exceeding 99.6%, which indicate the admirable UV light transmission through the Ta$_2$O$_5$ films. Comparable trend was stated in the case of Ta$_2$O$_5$ films prepared on quartz. Further, the attained transmittance values (>99%) for the post-annealed Ta$_2$O$_5$ films in the UV-B & A regime are better compared to the previously reported values using e-beam evaporation technique. This improvement in the transmittance value noticed after post-annealing process helps to remove the voids in the Ta$_2$O$_5$ films and provide subsequent improvement of optical superiority.

Figure 4A:
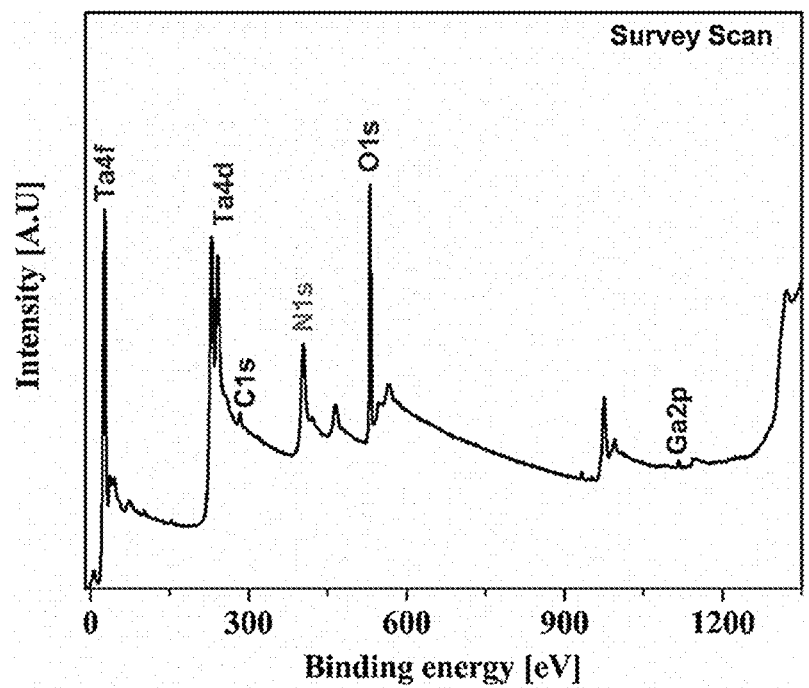
FIG. 4A graphically displays a Survey scan.
Figure 4B:
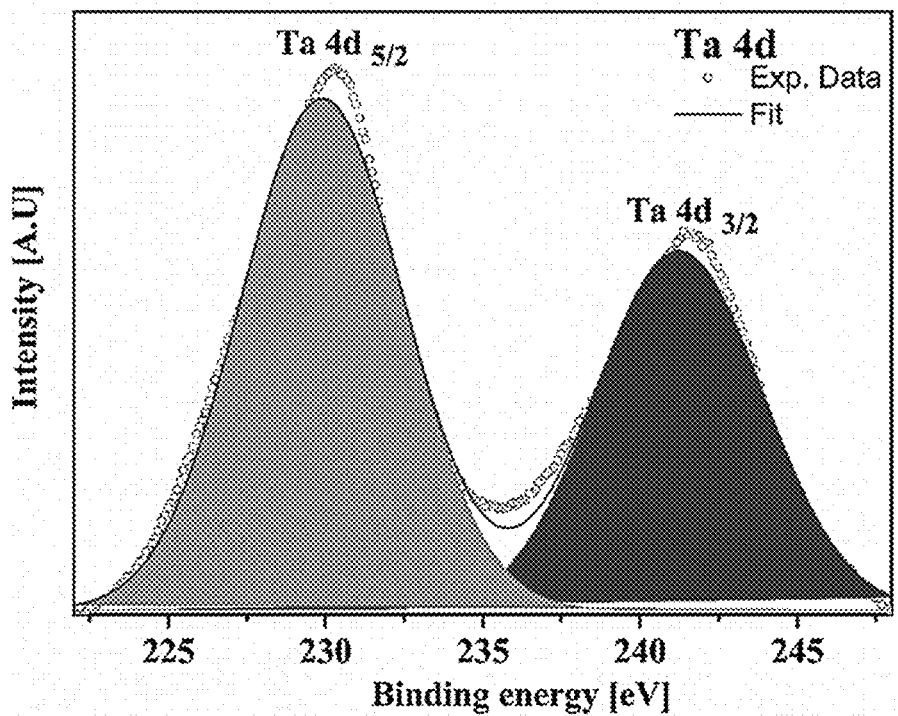
FIG. 4B shows Ta 4d.
Figure 4C:
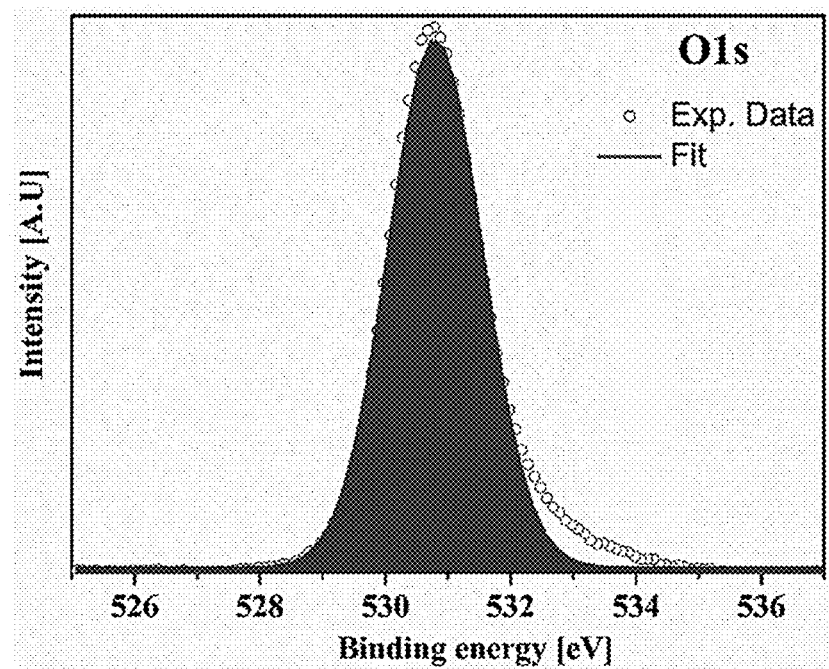
FIG. 4C shows O1s and FIG. 4D shows Ta 4f core level XPS spectra for the 800° C. post-annealed Ta$_2$O$_5$/GaN stack.
Figure 4D:
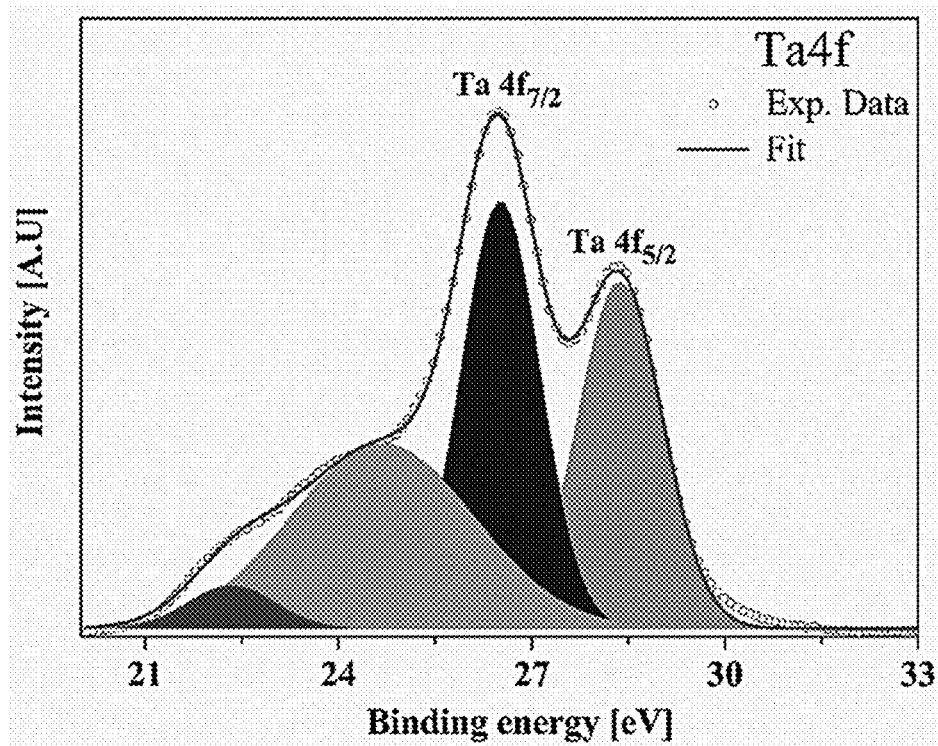

FIG. 4A graphically displays a Survey scan, FIG. 4B shows Ta 4d, FIG. 4C shows O1s and FIG. 4D shows Ta 4f core level XPS spectra for the 800° C. post-annealed Ta$_2$O$_5$/GaN stack. To examine the elemental composition/stoichiometry, XPS measurement is conducted for the 800° C. post-annealed Ta$_2$O$_5$/GaN sample stack. The XPS survey scan spectrum reveals the existence of Ta 4f, Ta 4d, C 1s, N 1s, O 1s and Ga$_2$p peaks as indicated in FIG. 4A. The Ta4d core level XPS spectrum is displayed in FIG. 4B. As demonstrated in FIG. 4B, the Ta 4d$_{5/2}$ and Ta 4d$_{3/2}$ peaks of core level are positioned at 230.3 eV and 241.6 eV. These core level peaks are in accordance with those reported at 230.2 eV and 241.7 eV, evidencing the occurrence of Ta$^{5+}$ state. The satellite peaks of Ta4d spectra attained in the deconvolution process are also situated approximately nearer to the experimental peaks. FIG. 4C indicates the O 1s peak at ~529.9 eV and this peak may be attributed to the presence of oxygen in the Ta$_2$O$_5$ material. The Ta4f core level XPS spectrum is shown in FIG. 4D. As displayed in FIG. 4D, the Ta 4f7/2 and Ta 4f5/2 core level peaks are positioned at 26.4 eV and 28.3 eV. These core level peaks agree with the previously reported peaks of 25.98 eV and 27.82 eV demonstrating the existence of $Ta^{5+}$ state. Further, FIG. 4D illustrates the satellite peaks which are noticed at 22.3 eV, 24.66 eV, 26.3 eV and 28.3 eV. These satellite peaks noticed at 26.3 eV and 28.3 eV are consistent with the formerly reported peaks of Ta $4f_{7/2}$ (25.98 eV) and Ta $4f_{5/2}$ (27.82 eV). These satellite peaks validate the existence of Ta-metal in the form of $Ta^{5+}$ in the $Ta_2O_5$ film involving the shake-up procedures of electrons which are adjacent to the Fermi level.

Figure 5A:
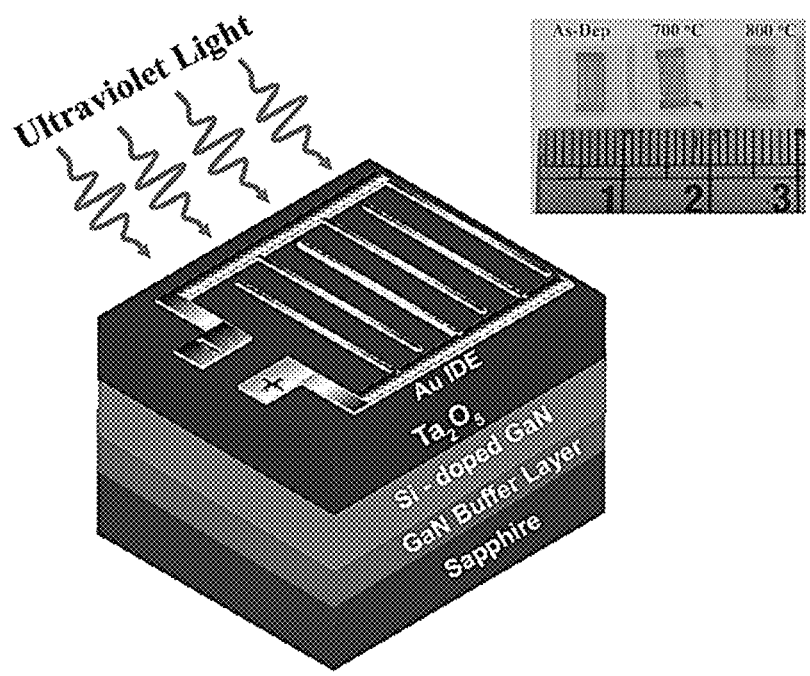
FIG. 5A is a schematic illustration of the fabricated Au/Ta$_2$O$_5$/n-GaN PD device.
Figure 5B:
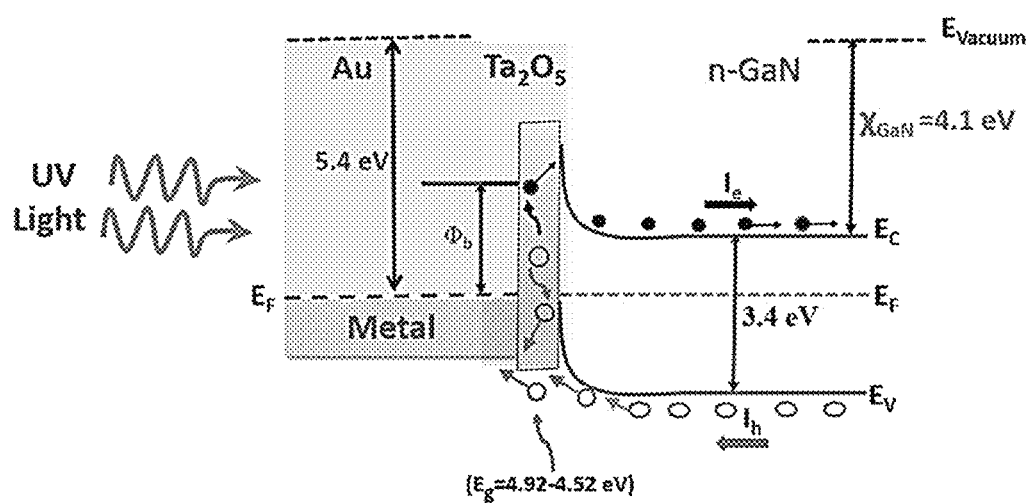
FIG. 5B shows an energy band diagram for the fabricated Au/Ta$_2$O$_5$/n-GaN UV PD device at zero-bias under the illumination of UV light.
Figure 7A:
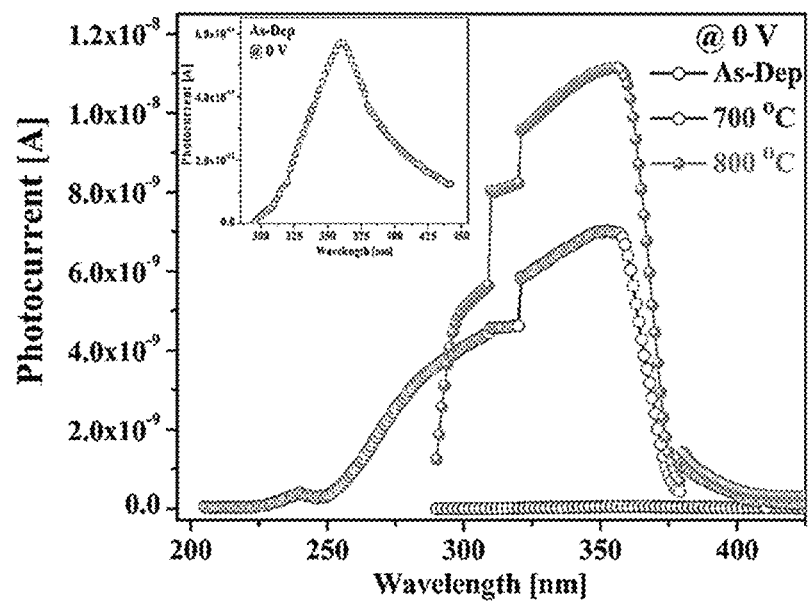
FIGS. 7A-7C show (FIG. 7A) photocurrent (FIG. 7B) photoresponsivity, and (FIG. 7C) EQE versus wavelength plots measured from the Au/Ta$_2$O$_5$/n-GaN PD devices as a function of annealing process.
Figure 7B:
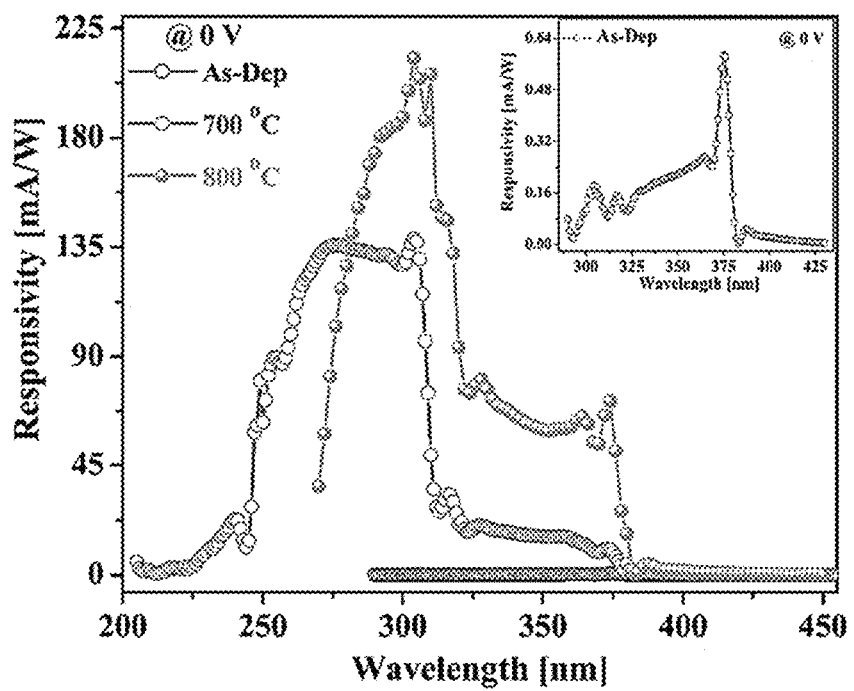
Figure 7C:
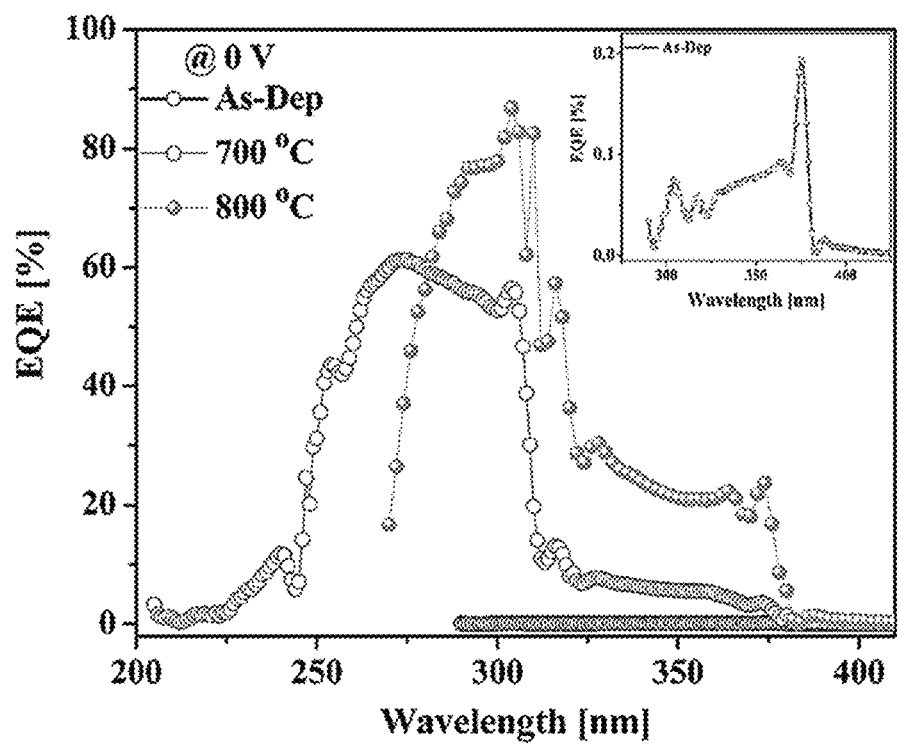
Figure 8A:
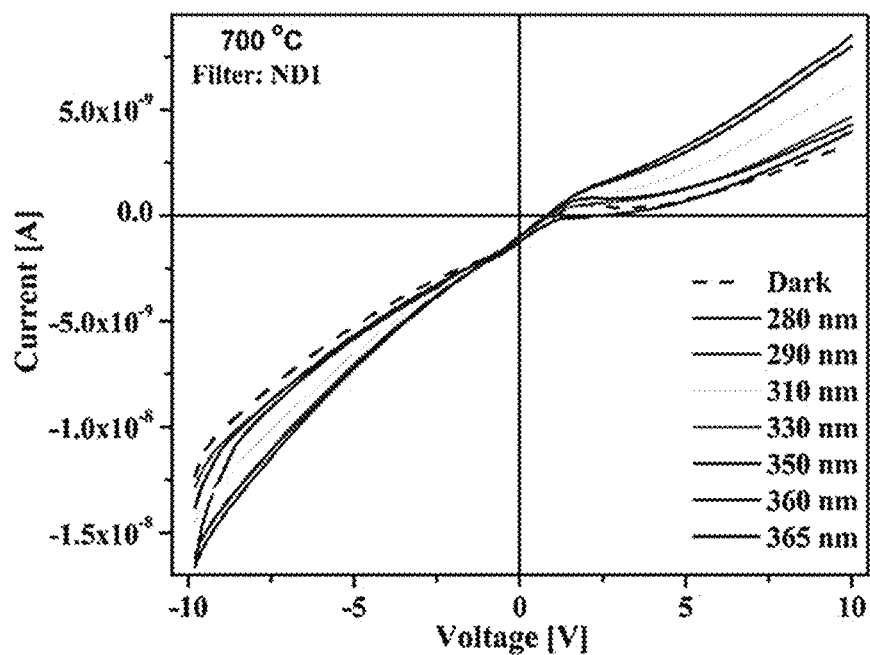
FIGS. 8A-8D show the current-voltage (I-V) curves measured from the 700° C.
Figure 8B:
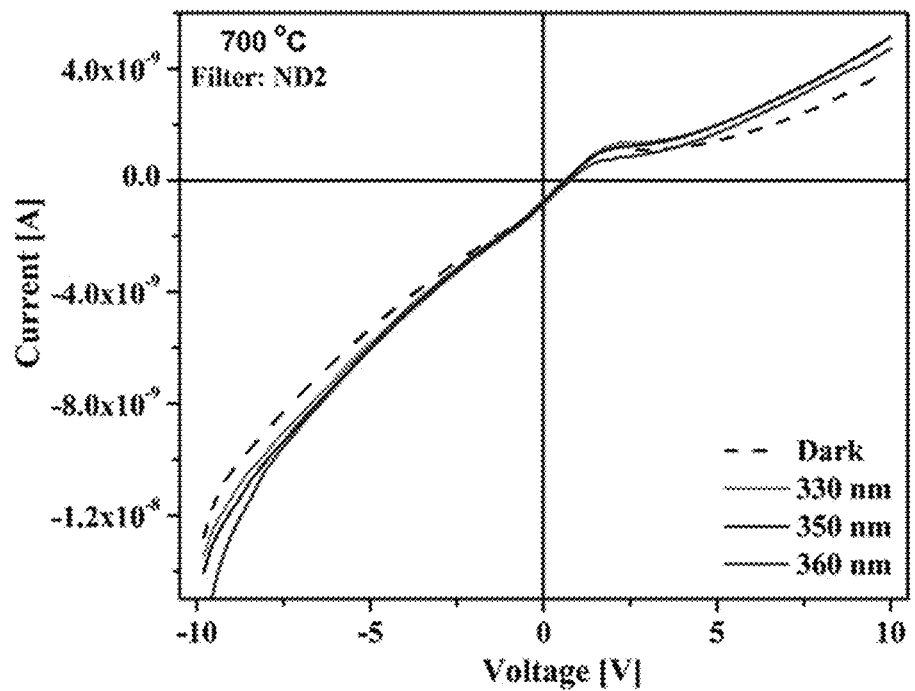
Figure 8C:
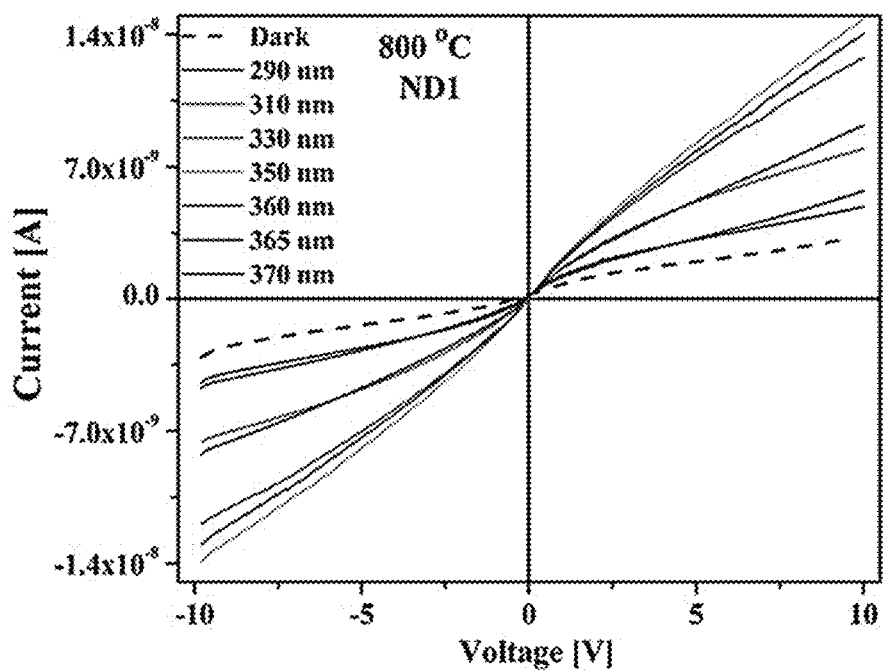
Figure 8D:
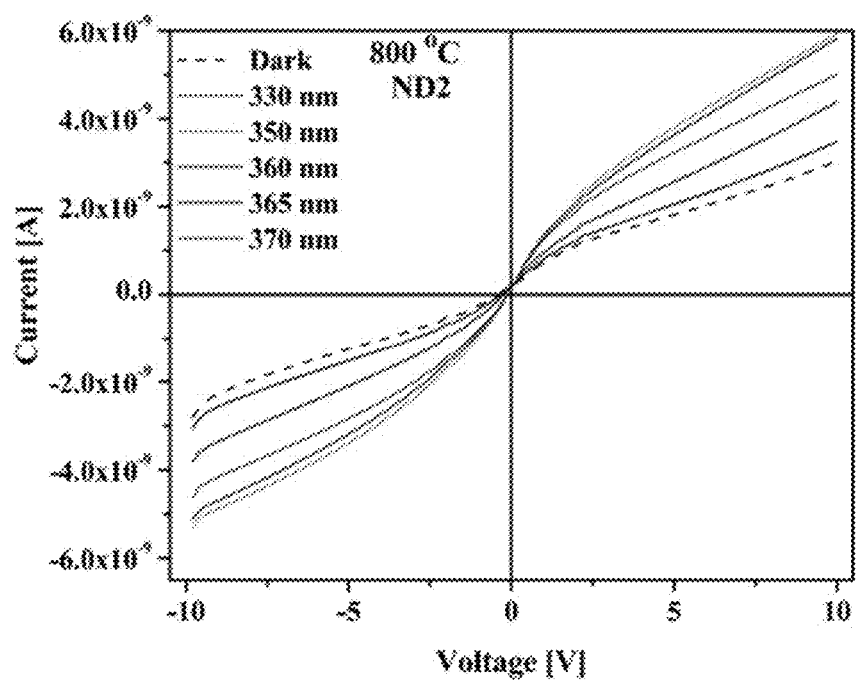

FIG. 5A is a schematic illustration of the fabricated Au/$Ta_2O_5$/n-GaN PD device, and FIG. 5B shows an energy band diagram for the fabricated Au/$Ta_2O_5$/n-GaN UV PD device at zero-bias under the illumination of UV light. Considering assessment of photo sensing parameters from Au/$Ta_2O_5$/GaN PD device in the UV-C to A region, a pictorial illustration of the fabricated Au/$Ta_2O_5$/GaN UV PD device and the equivalent band diagram with charge carrier generation mechanism is demonstrated in FIGS. 5A and 5B, respectively.

chromator and the fabricated post-annealed PD devices. FIGS. 7A-7C show (FIG. 7A) photocurrent (FIG. 7B) photoresponsivity, and (FIG. 7C) EQE versus wavelength plots measured from the Au/$Ta_2O_5$/n-GaN PD devices as a function of annealing process. The incident powers of the illuminated light are reduced to ~10% and 1% using ND1 and ND2 filters, respectively. At −9 V, the I-V analysis performed with ND1 filter in the UV-C, B and A region for 700° C. post-annealed PD device unveil the dark and photocurrents (350 nm) of $9.7 \times 10^{-9}$ A and $1.3 \times 10^{-8}$ A, respectively (FIG. 8A). Alternatively, 700° C. PD device with ND2 filter responds in UV-A region only (FIG. 8B) and displays dark and photocurrents (350 nm) of $9.7 \times 10^{-9}$ A and $1.1 \times 10^{-8}$ A, respectively. The measured dark and photoinduced currents at 350 nm for the 800° C. post-annealed device using ND1/ND2 filter are calculated as $2.5 \times 10^{-9}$ A and $1.28 \times 10^{-8}$ A/$4.9 \times 10^{-9}$ A, respectively (FIGS. 8C and 8D). Thus, I-V analysis conducted under dark and illumination of UV light concludes that the post-annealed PD devices responds even after the optical power reduced by means of the ND1 and ND2 filters.

TABLE 1

Comparison of calculated photodetection parameters with previous reports in literature

| Device configuration | Wavelength range (nm) | Optical power | Bias (V) | R (mA/W) | EQE (%) | D* (Jones) | Rise/Fall time (s) |
|---|---|---|---|---|---|---|---|
| Au/Ni/$La_2O_3$/GaN | 340 | µW | 5 | 53-270 | — | $2.4 \times 10^7$-$7.4 \times 10^{11}$ | — |
| Au/$HfO_2$/GaN | 360 (260-420) | Xenon arc lamp | 15 | 0.75 | — | $1.89 \times 10^{12}$ | — |
| Ni/Au/$Ga_2O_3$/GaN | 256/365 (200-400) | mW | 5 | 370 | 87.5 | $4.7 \times 10^{10}$ | — |
| In/$SnO_2$/GaN | 300-400 | mW | 0 | 185 | 74 | — | $3.1 \times 10^{-7}$/$6.1 \times 10^{-5}$ |
| Ag/Al-Alloy/GaN/Al | 365 | mW | −5 | 19-68 | 6.7-24.4 | — | 2.4-2.8/3.1-3.7 |
| Au/$Ta_2O_5$/GaN (Without ND filters) | UV-C to A | | | | | | |
| As-Dep | 280-380 | µW | 0 | 0.58 (@365 nm) | 0.19 | $2.5 \times 10^{11}$ | 4.94/7.73 (@360 nm) |
| 700° C. | 220-380 | | | 138 (@310 nm) | 56.4 | $6.8 \times 10^{12}$ | 0.43/1.12 (@350 nm) |
| 800° C. | 280-380 | | | 212 (@310 nm) | 86.8 | $1.5 \times 10^{13}$ | 0.09/0.79 (@350 nm) |

Figure 6A:
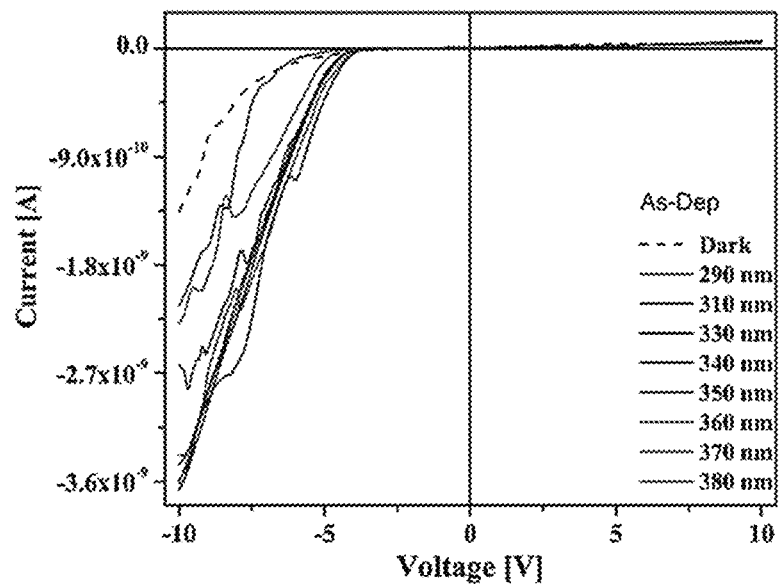
FIGS. 6A-6C show the I-V curves measured from the (FIG. 6A) as-deposited (FIG. 6B) 700° C.
Figure 6B:
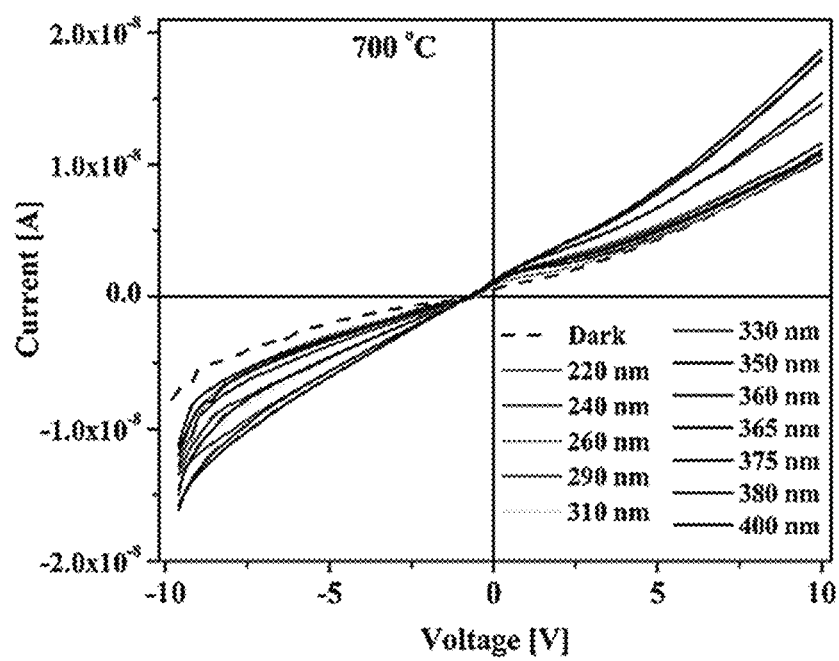
Figure 6C:
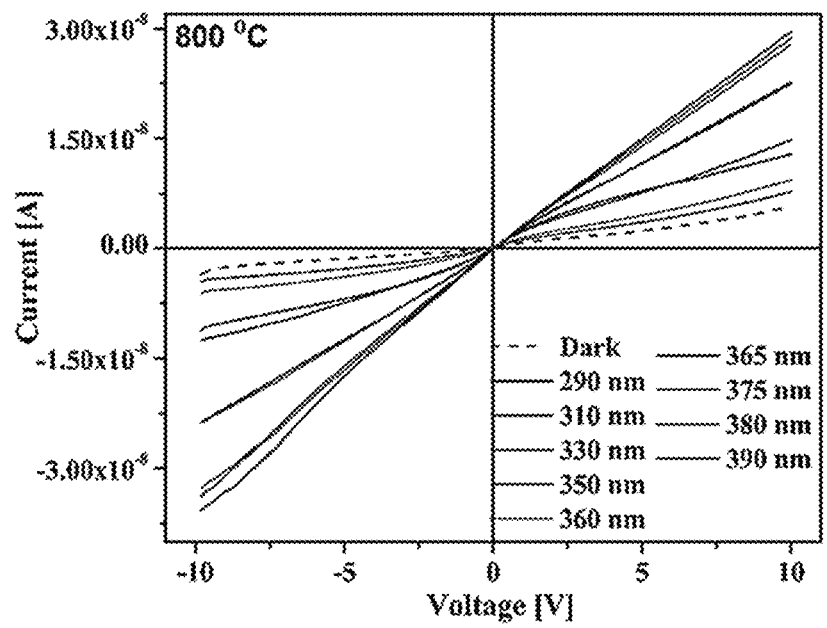

FIGS. 6A-6C show I-V curves measured from the (FIG. 6A) as-deposited (FIG. 6B) 700° C. and (FIG. 6C) 800° C. Au/$Ta_2O_5$/n-GaN PD devices up to ±10 V bias. The current-voltage (I-V) curves extracted from the as-deposited, 700° C. and 800° C. Au/$Ta_2O_5$/n-GaN PD devices in dark and under illumination of UV light in various regions were represented in FIGS. 6A-6C. I-V data analysis indicated that the extracted curves are distinguishable from each other and preferable wavelength selectivity of the prepared GaN based MIS UV PD devices is 350 nm. Generally, when UV light is illuminated on GaN semiconductor through Au/$Ta_2O_5$ interface absorbs the photons of energy exceeding the $E_g$ of GaN (~3.4 eV) generating photoinduced charge carriers in the UV-A region (320-380 nm) only. However, using a single post-annealed Au/$Ta_2O_5$/GaN PD device, the spectral responsivity is covered from the UV-C to UV-A region (270-380 nm) due to the superior absorbance of UV-C light as well as transmittance of UV-B and A light.

The electrical and photosensitive parameters of the prepared Au/$Ta_2O_5$/GaN MIS UV PD devices are tested by reducing the incident light power using neutral density filters. ND1 and ND2 filters are introduced between mono-

TABLE 2

Calculated rise and fall times measured from the as-deposited and post-annealed UV PD devices without using neutral density filters

| Wavelength (nm) | Rise (Sec.) | Fall (Sec.) | Rise (Sec.) | Fall (Sec.) | Rise (Sec.) | Fall (Sec.) |
|---|---|---|---|---|---|---|
| 240 | — | — | 0.99 | 1.24 | — | — |
| 260 | — | — | 0.97 | 1.21 | — | — |
| 290 | — | — | 0.65 | 1.16 | 0.51 | 1.68 |
| 310 | 6.71 | 12.8 | 0.51 | 1.15 | 0.38 | 0.84 |
| 330 | 5.10 | 8.16 | 0.45 | 1.13 | 0.19 | 0.80 |
| 340 | 5.71 | 8.27 | 0.45 | 1.14 | 0.11 | 0.85 |
| 350 | 5.93 | 7.92 | 0.43 | 1.12 | 0.09 | 0.79 |
| 360 | 4.94 | 7.73 | 0.44 | 1.13 | 0.11 | 0.80 |
| 365 | 5.20 | 7.97 | 0.55 | 1.15 | 0.14 | 0.81 |
| 370 | — | 9.87 | 0.81 | 1.19 | 0.15 | 1.07 |
| 380 | — | — | 1.04 | 1.23 | 1.15 | 1.34 |
| 390 | — | — | 1.16 | 1.33 | 1.60 | 2.90 |

TABLE 3

Evaluated rise and fall times measured from the 700° C. and 800° C. post-annealed Au/Ta₂O₅/GaN UV PD devices using neutral density filters ND-1 and ND-2

| @3 V | 700° C.: ND-1 | | 700° C.: ND-2 | | 800° C.: ND-1 | | 800° C.: ND-2 | |
|---|---|---|---|---|---|---|---|---|
| Wavelength (nm) | Rise (Sec.) | Fall (Sec.) | Rise (Sec.) | Fall (Sec.) | Rise (Sec.) | Fall (Sec.) | Rise (Sec.) | Fall (Sec.) |
| 280 | 1.66 | 2.44 | — | — | — | — | — | — |
| 290 | 1.45 | 1.80 | — | — | 1.47 | 1.75 | — | — |
| 310 | 0.82 | 1.08 | 0.89 | 1.31 | 0.95 | 1.26 | — | — |
| 330 | 0.52 | 0.94 | 0.77 | 0.97 | 0.73 | 1.07 | 1.22 | 1.38 |
| 350 | 0.65 | 0.92 | 0.91 | 1.09 | 0.66 | 1.05 | 1.21 | 1.39 |
| 360 | 0.14 | 0.82 | 0.63 | 0.96 | 0.65 | 1.07 | 1.16 | 1.34 |
| 365 | 0.78 | 0.92 | 1.54 | 1.26 | 0.85 | 1.21 | 1.24 | 1.51 |
| 370 | 1.07 | 1.47 | — | — | 1.03 | 1.14 | 1.68 | 1.82 |

FIGS. 8A-8D show the current-voltage (I-V) curves measured from the 700° C. (FIGS. 8A and 8B) and 800° C. (FIGS. 8C and 8D) post-annealed Au/Ta₂O₅/n-GaN PD devices up to ±10 V bias.

Figure 9A:
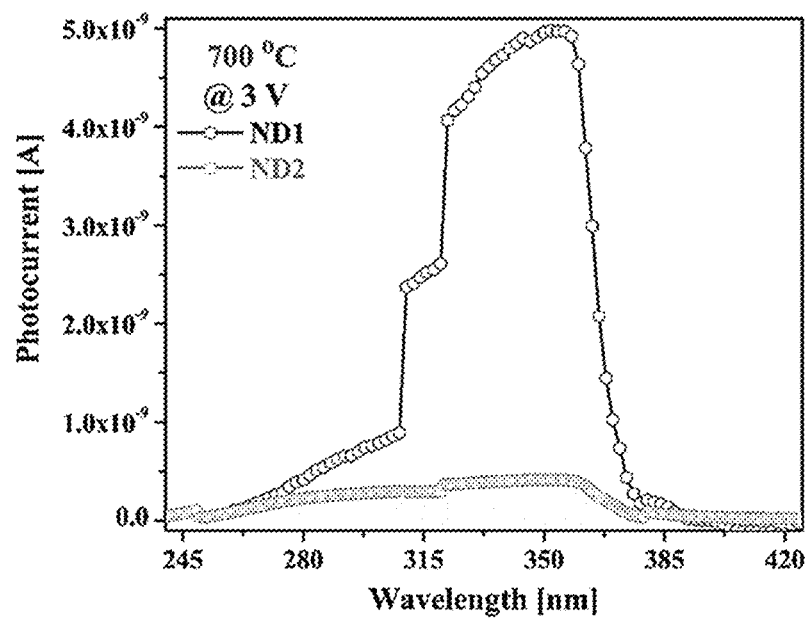
FIGS. 9A-9F show (FIGS. 9A and 9D photocurrent, (FIGS. 9B and 9E) photoresponsivity and (FIGS. 9C and 9F) EQE versus wavelength plots measured from the Au/Ta$_2$O$_5$/n-GaN PD devices as a function of annealing process using ND-1 and ND-2 filters measured from the 700° C. and 800° C. post-annealed PD devices.
Figure 9B:
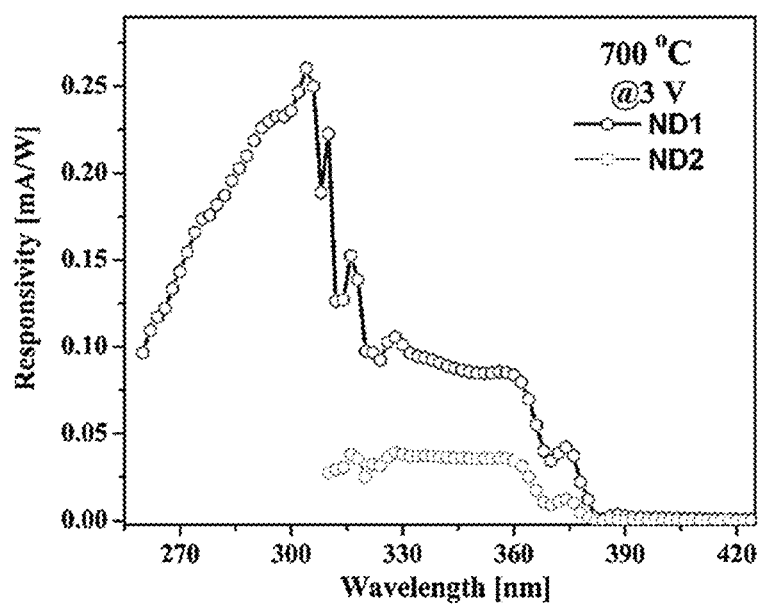
Figure 9C:
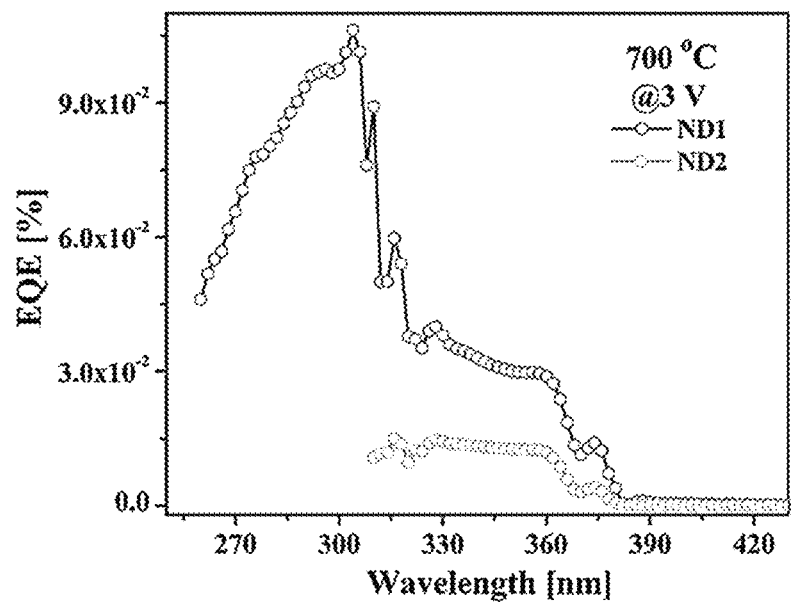
Figure 9D:
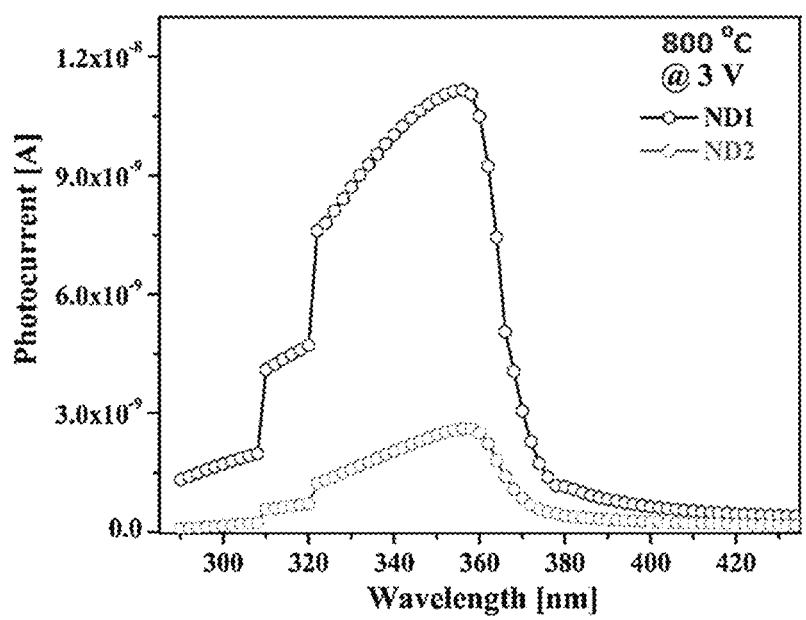
Figure 9E:
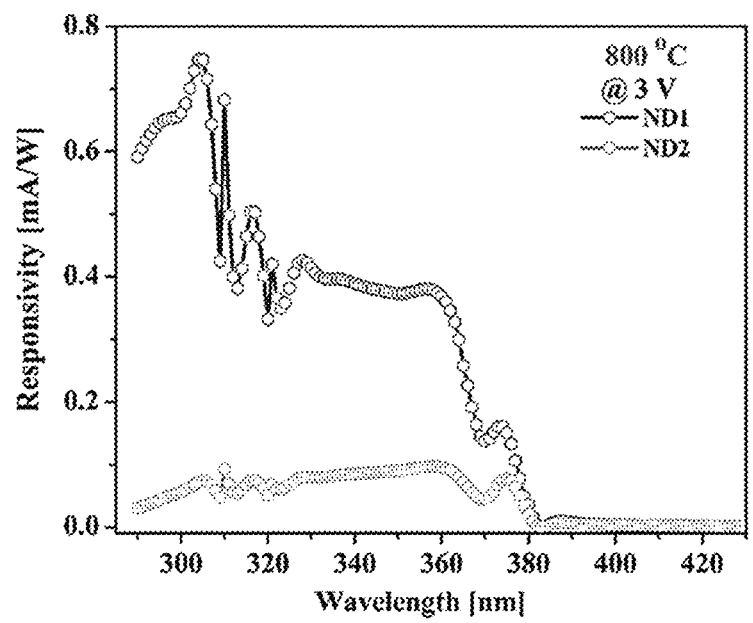
Figure 9F:
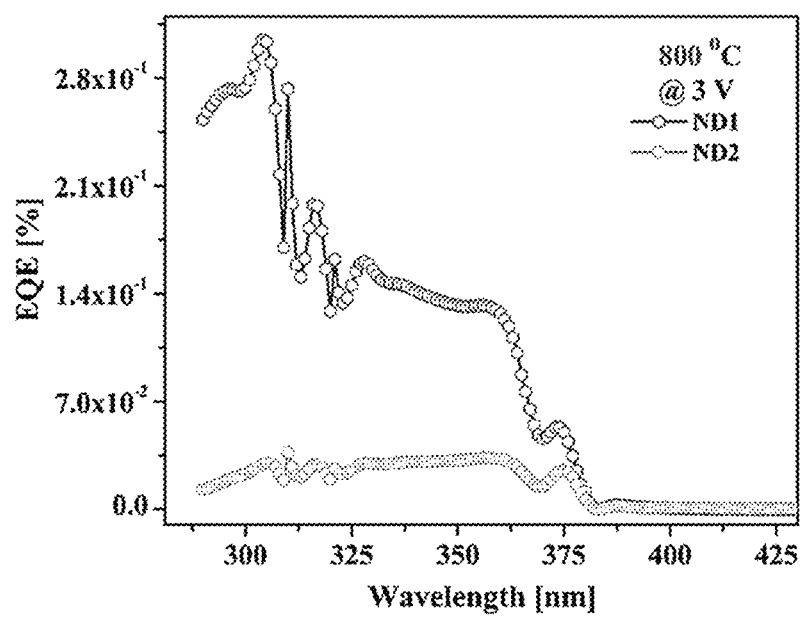

The photocurrent versus wavelength spectra extracted from the fabricated Au/Ta₂O₅/GaN PD devices at 0 V are exemplified in FIG. 7A. The as-deposited and 800° C. post-annealed MIS UV PD devices respond in the UV-B & A regions. On the other hand, the 700° C. post-annealed PD device exhibit superior photo-sensing in the UV-C, B and A regions. Comparable photocurrent spectrum is reported in the wavelength range of 220-380 nm for Al/SiN/GaN: MIS type UV PD device. Further, these evaluated photocurrent values (FIG. 7A) are almost same when compared to the experientially observed photocurrent values as evidenced in the I-V characteristics (FIGS. 6A-6C). The photocurrent versus wavelength data measured for the 700° C. and 800° C. post-annealed PD devices with the ND1 and ND2 filters are illustrated in FIGS. 9A and 9D, respectively. One of the important parameters of the PD device is photoresponsivity (R) and may be assessed using the following equation:

$$R = (I_{photo} - I_{dark})/P_{inc} \quad (2)$$

At 0 V, the experimental photoresponsivity (R) versus wavelength (λ) data attained from the Au/Ta₂O₅/GaN PD device are exemplified in FIG. 7B. As indicated in FIG. 7B, the peak responsivities measured for the as-deposited, 700° C. and 800° C. post-annealed PD devices are 0.58 mA/W (@365 nm), 138 mA/W (310 nm) and 212 mA/W (310 nm), respectively. The as-deposited and 800° C. post-annealed PD devices exhibit photo-response in the UV-B and A regions, whereas the 700° C. post-annealed PD device exhibits superior and extended broadband photo response from the UV-C to A region (210 nm to 380 nm). This photoresponsivity data is consistent with the photocurrent versus wavelength data as depicted in FIG. 7A. These calculated responsivity values are compared with the previous reports of GaN based UV PD devices (as shown in Table 1). Further, ND1 (~10%) and ND2 (1%) filters are utilized to lower the transmission of the illuminated light from the monochromator before reaching post-annealed PD devices and for checking the sensitivity. At 0 V, the post-annealed PD devices do not respond to the incident UV light when passed through the ND filters due to the reduction of optical powers. However, they respond to UV light when the applied bias is increased to 3V. At 310 nm (@3V), the peak responsivities evaluated for 700° C. UV-C to A PD device using ND1 and ND2 filters (FIG. 9B) are 0.26 mA/W and 0.03 mA/W, respectively, whereas the 800° C. post-annealed UV-B to A PD device (@3V) displays peak responsivities of 0.74 mA/W and 0.09 mA/W using ND1 and ND2 filters (FIG. 9E), respectively. As expected, the post-annealed PD devices are sensitive even the optical power has been reduced using ND filters. These obtained photoresponsivity values in accordance with the present invention are compared with the earlier reports of GaN based UV PD devices. Another well known photo sensing parameter of the PD device is EQE and can be estimated by the equation:

$$EQE(\%) = \frac{R \times 1240 \times 100}{\lambda} \quad (3)$$

FIGS. 9A-9D show (FIGS. 9A and 9D) photocurrent, (FIGS. 9B and 9E) photoresponsivity and (FIGS. 9C and 9F) EQE versus wavelength plots measured from the Au/Ta₂O₅/n-GaN PD devices as a function of annealing process using ND-1 and ND-2 filters measured from the 700° C. and 800° C. post-annealed PD devices.

FIG. 7C displays the EQE versus λ data measured from the Au/Ta₂O₅/GaN MIS UV PD devices at zero bias in the UV-C to A region. As displayed in FIG. 7C, the as-deposited PD device exhibit EQE of 0.19% at 365 nm. At 310 nm, the peak EQE values of 56.4% and 86.8% are calculated for the 700° C. and 800° C. post-annealed PD devices, respectively. These assessed EQE values are compared with the former reports of UV PD devices and tabulated in Table 1. At 310 nm (@3V), the peak EQE values evaluated for 700° C. UV-C to A PD (FIG. 9C) device using ND1 and ND2 filters are $1 \times 10^{-1}\%$ and $1.4 \times 10^{-2}\%$, respectively, whereas the 800° C. UV-B to A PD device (FIG. 9F) at 3V displayed peak EQEs of $3 \times 10^{-1}\%$ and $3.1 \times 10^{-2}\%$ using ND1 and ND2 filters, respectively. As expected, even the optical power is reduced using ND filters, the post-annealed PD devices are responding to the illuminated UV light. As illustrated in Table 1, the evaluated EQEs for the 700° C. and 800° C. annealed Au/Ta₂O₅/GaN MIS PD devices without utilizing ND filters exhibit improvement when compared with the previous reports. Generally, the values of responsivities and EQEs extracted from the PD devices with various types of geometries mainly depend on type of the metals/interfacial oxides deposited on GaN semiconductor. Likewise, dimensions of the device such as spacing between the electrodes and shape of the electrodes either circular or rectangular also affect the attained responsivity values. Further, the above said factors influence the created SBH and generated electric field values at the MIS interfaces of the PD devices, influencing the effective generation/separation/collection of the photoinduced electron-hole pairs. Detectivity (D*) is one of the significant PD device parameters and can be estimated by means of the equation:

$$D^* = \frac{RA^{1/2}}{(2eI_D)^{1/2}} \quad (4)$$

The D* values are evaluated (1 Jone=1 cmHz$^{1/2}$ W$^{-1}$) using equation 4 for the Au/Ta$_2$O$_5$/GaN MIS PD devices as a function of post-annealing temperature. At 0 V, the calculated maximum D* values for the as-deposited, 700° C. and 800° C. post-annealed PD devices are 2.5×10$^{11}$ Jones (at 370 nm), 6.8×10$^{12}$ Jones (at 310 nm) and 1.5×10$^{13}$ Jones (at 310 nm), respectively. These D* values in accordance with the present invention are compared with earlier reports of GaN based UV PD devices and tabulated in Table 1. At 310 nm (@3V), the peak D* values assessed for 700° C. UV-C to A PD device using ND1 and ND2 filters are 6.1×10$^9$ J and 7.2×10$^8$ J, respectively, whereas the 800° C. UV-B to A PD device at 3 V displayed peak D* value of 2.6×10$^{10}$ J (ND1 filter) and 3.3×10$^9$ J (ND2 filter), respectively. As expected, even the optical powers have been reduced using ND filters, the post-annealed PD devices are responding for the illuminated UV light. As exemplified in Table 1, the estimated D* values of the 700° C. and 800° C. annealed Au/Ta$_2$O$_5$/GaN MIS UV PD devices without using ND filters exhibit an improvement in comparison to previous reports.

Figure 10A:
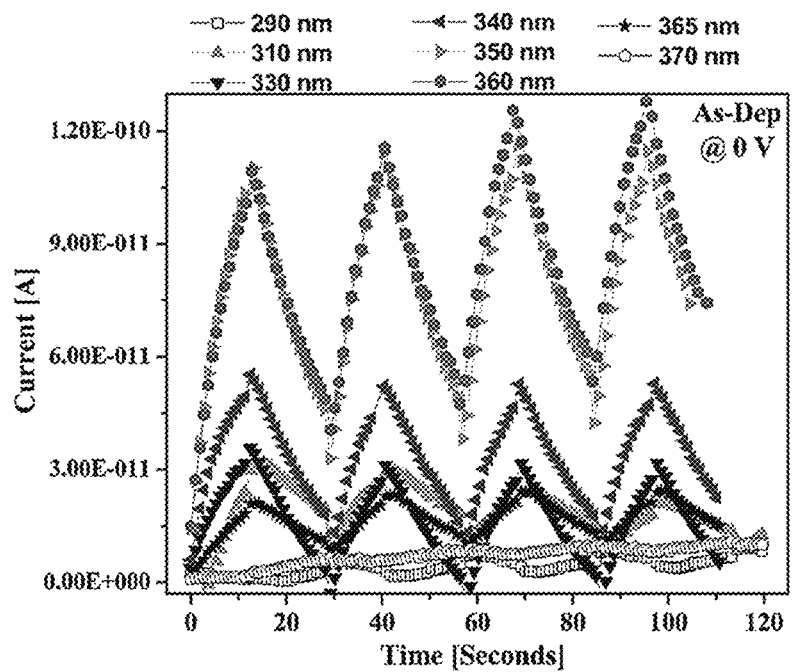
FIGS. 10A-10F graphically show current versus time (I-t) data measured at 0 V in UV region from the as-deposited (FIG. 10A), 700° C.
Figure 10B:
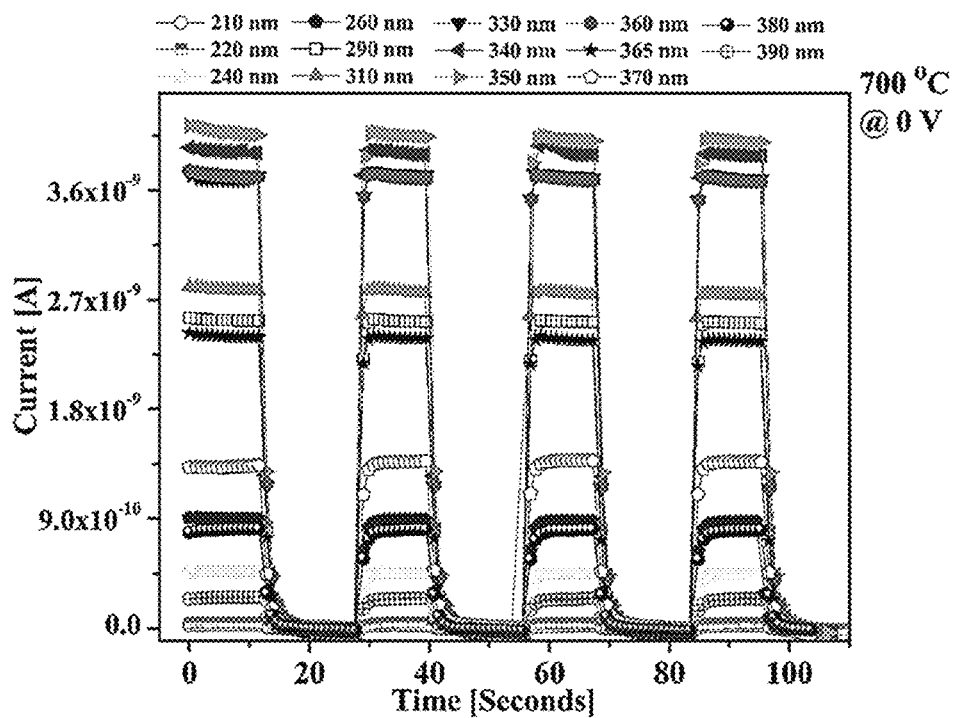
Figure 10C:
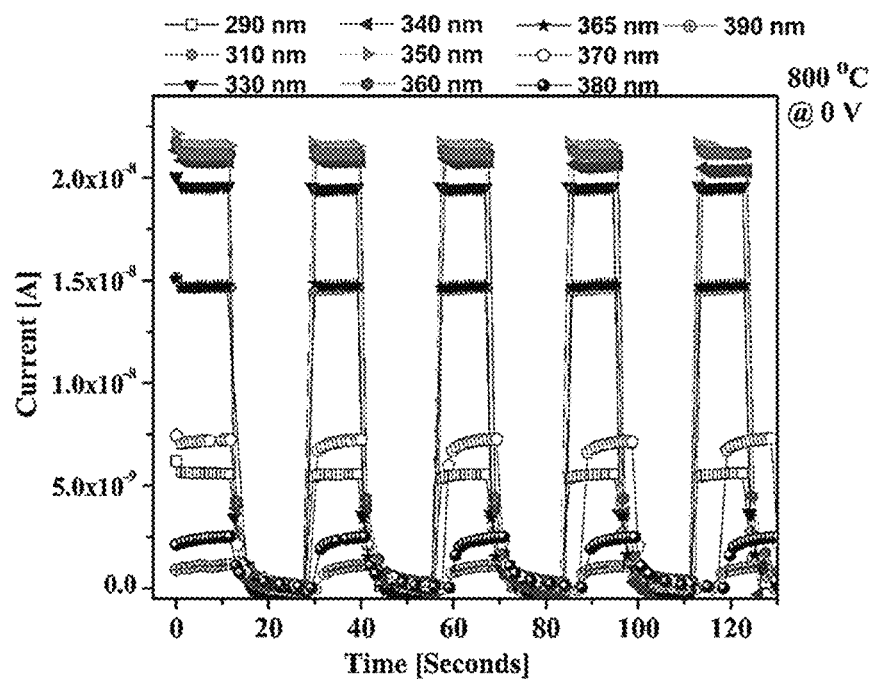

FIGS. 10A-10F graphically show current versus time (I-t) data measured at 0 V in UV region from the as-deposited (FIG. 10A), 700° C. (FIG. 10B) and 800° C. (FIG. 10C) post-annealed Au/Ta$_2$O$_5$/n-GaN PD devices and the corresponding growth/decay time fittings made using equations 5 and 6 for the as-deposited (FIG. 10D), 700° C. (FIG. 10E) and 800° C. (FIG. 10F) post-annealed Au/Ta$_2$O$_5$/n-GaN PD devices. FIGS. 10A-10C indicates the temporal measurements (I-t data) attained from the fabricated Au/Ta$_2$O$_5$/GaN MIS UV PD devices in the as-deposited and post-annealing conditions at 0 V. With these temporal data, the growth and decay time constants are calculated using the following equations 5 and 6:

$$I(t) = I_{dark} + A[1 - \exp\{-(t-t_0)/\tau_{rise}\}] \quad (5)$$

$$I(t) = I_{dark} + A[\exp\{-(t-t_0)/\tau_{fall}\}] \quad (6)$$

Figure 10D:
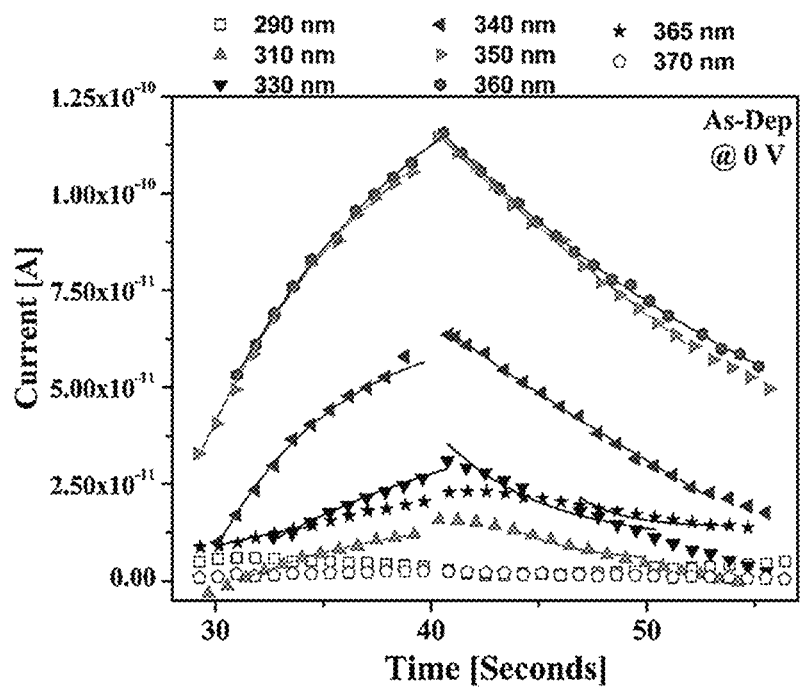
Figure 10E:
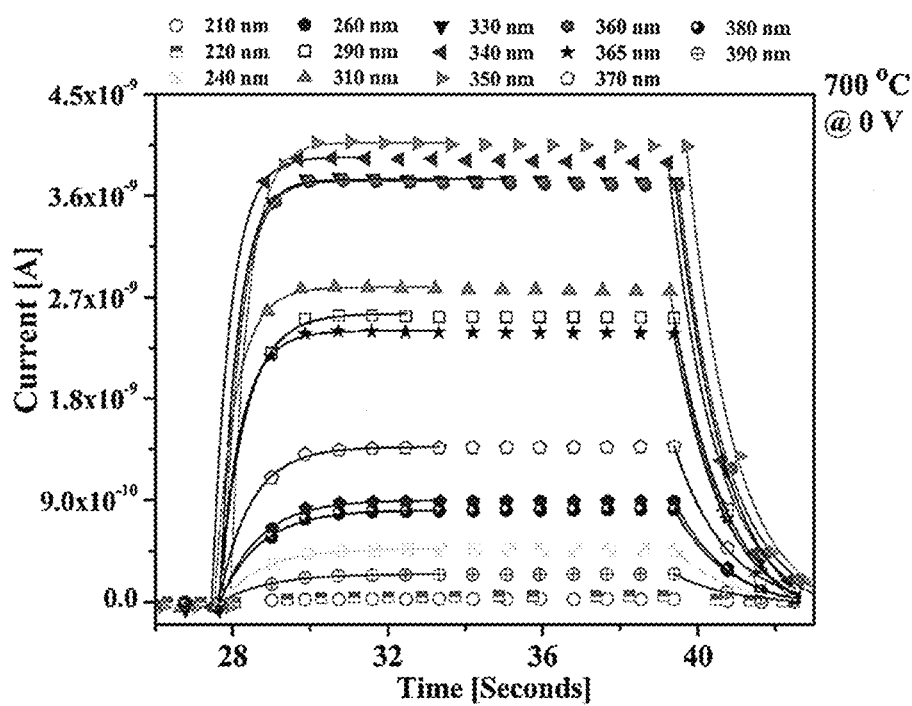
Figure 10F:
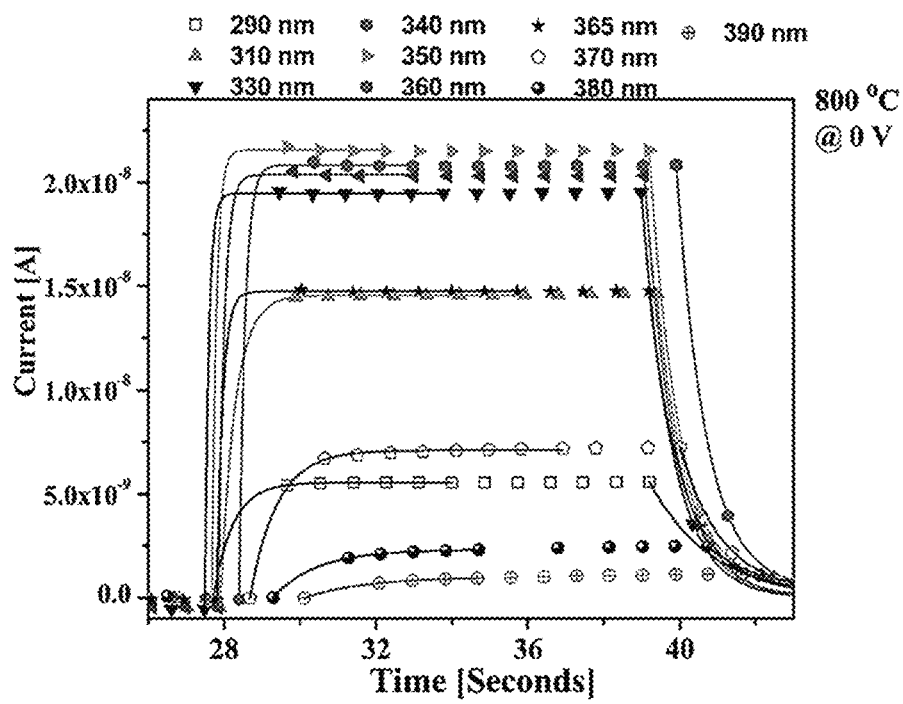

FIGS. 10D-10F indicate the fittings (solid lines) performed for the Au/Ta$_2$O$_5$/GaN UV PD devices using equations 5 and 6 whereas the symbols denote the experimentally measured I-t data. The best rise/fall times of 4.94 s/7.73 s are estimated at 360 nm for the as-deposited GaN based MIS PD device. At 350 nm, the obtained fittings (solid lines) for the 700° C. and 800° C. post-annealed UV PD devices from I-t data (FIGS. 10E-10F) yielded best rise/fall times of 0.43/1.12 s and 0.09/0.79 s, respectively. At 0 V, the assessed values of rise/fall times with the incident UV light from the top of the fabricated vertical Au/Ta$_2$O$_5$/GaN MIS PD devices without using ND filters are tabulated in Table 2. The accomplished adjacent R$^2$ values while fitting the experimental data by means of equations 5 and 6 are in the range of 0.97-0.99 for the post-annealed PD devices suggesting best fittings compared with the as-deposited PD device as demonstrated in FIGS. 10E-10F. The experimentally obtained I-t data (FIGS. 10A-10C) unveiled a superior stability during the ON and OFF conditions of UV light.

Further, as noticed from Table 2, the attained rise/fall times in the UV-A region are practically smaller compared with those attained in UV-C & B regions due to the band edge of GaN (~3.4 eV). At 350 nm (@0V), the assessed rise times of the current work for the 800° C. annealed Au/Ta$_2$O$_5$/GaN MIS PD device without using ND filters are superior when compared to the earlier reports.

Figure 11A:
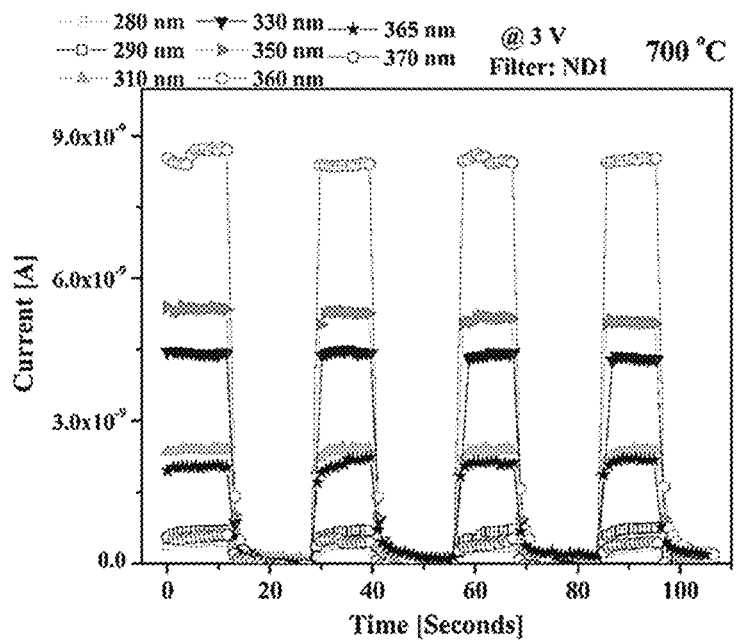
FIGS. 11A and 11B graphically show current versus time (I-t) data measured at 3 V in the UV region from the 700° C. post-annealed Au/Ta$_2$O$_5$/n-GaN PD device.
Figure 11B:
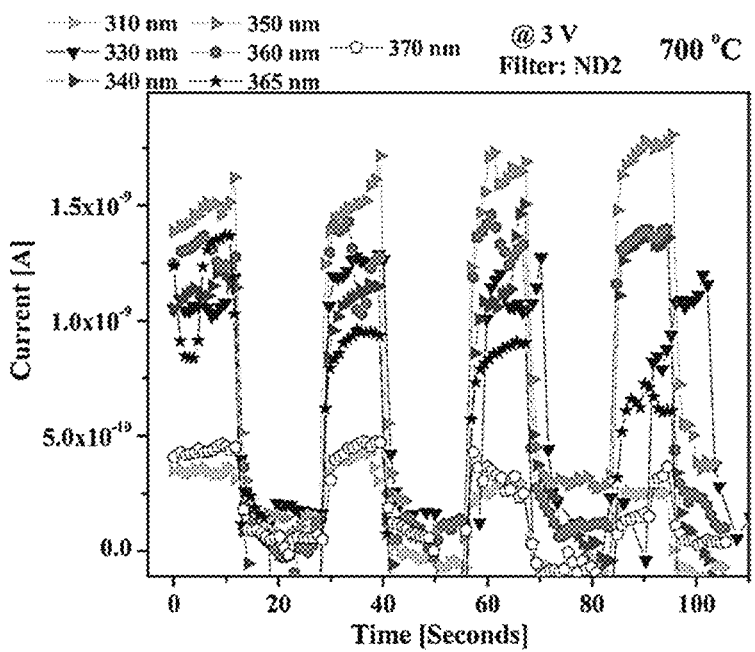
Figure 11C:
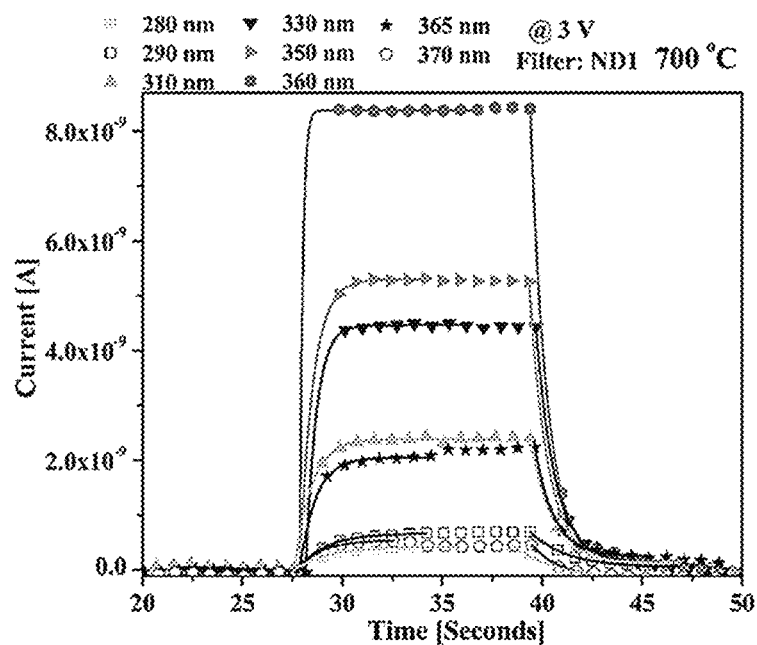
FIGS. 11C and 11D graphically show the corresponding growth and decay time fittings made using equations 5 and 6 using ND-1 and ND-2 filters for the 700° C. post-annealed Au/Ta$_2$O$_5$/n-GaN PD device.
Figure 11D:
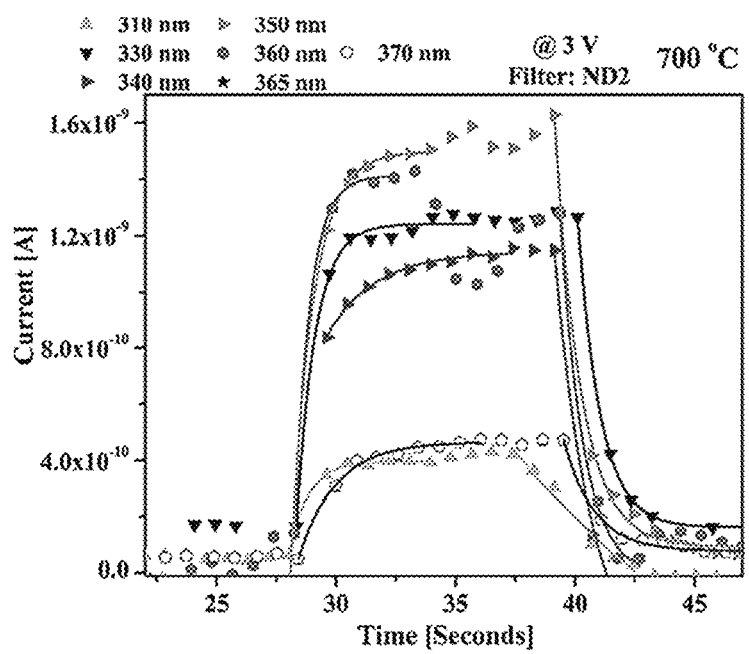
Figure 12A:
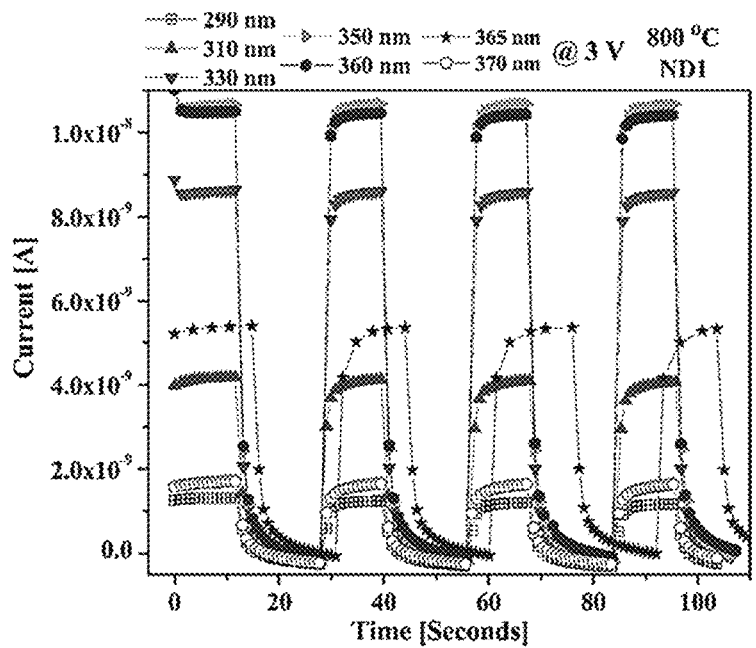
FIGS. 12A and 12B graphically show current versus time (I-t) data measured at 3V in the UV region from the 800° C. post-annealed Au/Ta$_2$O$_5$/n-GaN PD device.
Figure 12B:
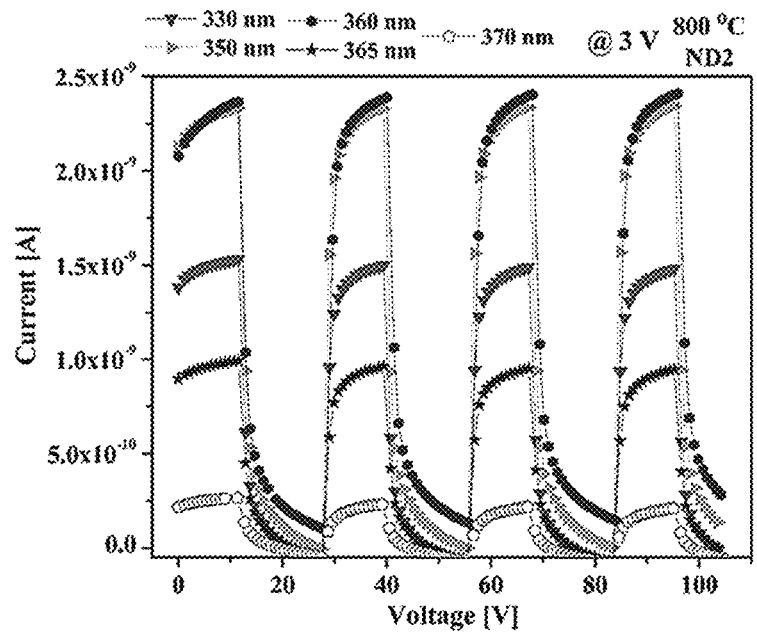
Figure 12C:
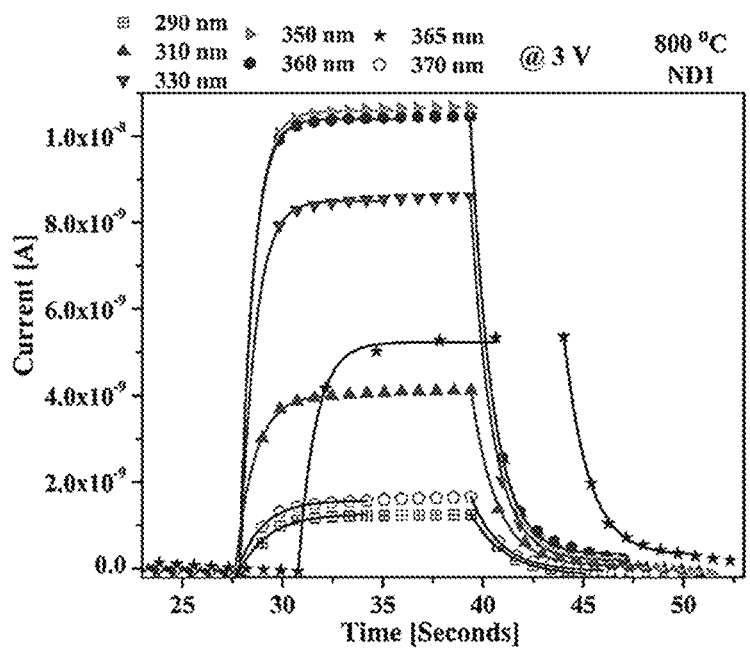
FIGS. 12C and 12D show the corresponding growth and decay time fittings made using equations 5 and 6 using ND-1 and ND-2 filters for the 800° C. post-annealed Au/Ta$_2$O$_5$/n-GaN PD device.
Figure 12D:
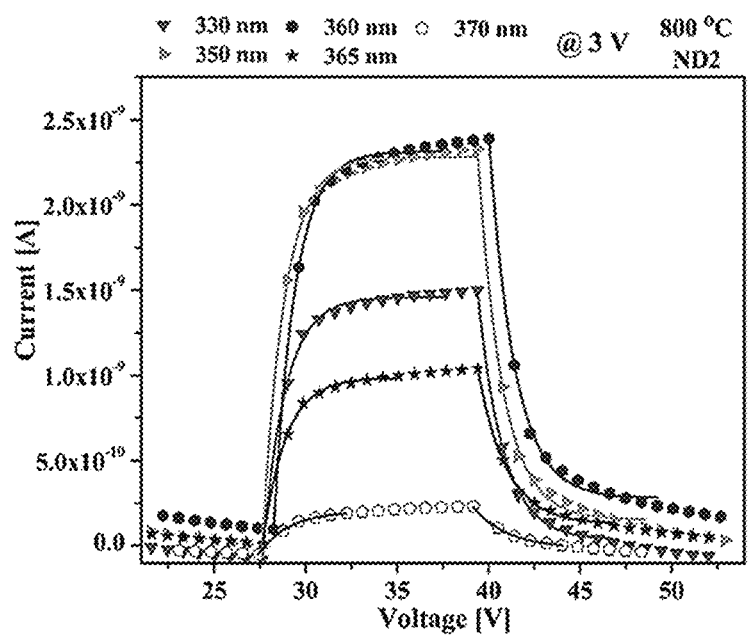

FIGS. 11A and 11B graphically show current versus time (I-t) data measured at 3 V in UV region from the 700° C. post-annealed Au/Ta$_2$O$_5$/n-GaN PD device. FIGS. 11C and 11D graphically show the corresponding growth and decay time fittings made using equations 5 and 6 using ND-1 and ND-2 filters. FIGS. 12A and 12B graphically show current versus time (I-t) data measured at 3 V in UV region from the 800° C. post-annealed Au/Ta$_2$O$_5$/n-GaN PD device. FIGS. 12C and 12D show the corresponding growth and decay time fittings made using equations 5 and 6 using ND-1 and ND-2 filters.

The reason for the attainment of larger fall times compared to the rise times was attributed to the presence of defect states in GaN and they serve as trap centers. At 3 V, the experimental I-t data (FIGS. 11A and 11B) measured from 700° C. post-annealed PD device using ND-1/ND-2 filters and the corresponding fittings are demonstrated in FIGS. 11C and 11D. Then again, FIGS. 12A and 12B signifies the experimental I-t data measured from 800° C. (@3V) post-annealed PD device using ND-1/ND-2 filters and the corresponding fittings are demonstrated in FIGS. 12C and 12D. As presented in Table 3, the obtained rise and fall time values using ND1 and ND2 filters were larger compared to those attained without using ND filters as presented in the Table 2. This is because of the reduction of illuminated optical power affecting the transfer rate of electrons/holes from the light absorbing GaN/Ta$_2$O$_5$ material to the conducting Au metal IDEs through Ta$_2$O$_5$ material. In accordance with the present invention, even the utilized optical powers are in the range of 0.43-79 μw/cm$^2$ (without using ND filters), a reasonable responsivity, EQE and rise/fall times are accomplished because of rapid generation/collection of photogenerated carriers at the interfaces of the MIS type PD devices under self-powered mode.

The proposed Au/Ta$_2$O$_5$/GaN UV PD device operates at 0 volts (photovoltaic mode). The electron beam (e-beam) evaporation is cost-effective with controllable high deposition rate/purity compared to PLD or ALD techniques. The e-beam evaporation route can be used for large area deposition of Ta$_2$O$_5$ films. In the UV regime, the attained average transmittance values of the annealed Ta$_2$O$_5$ films exceeding 99.6% beyond 300 nm indicates the admirable UV light transmission through Ta$_2$O$_5$ films and reaching underlying GaN semiconductor. The photodetection limit was tuned from UV-A (320-400 nm) to UV-C (200-280 nm) regions using the single post-annealed (700° C./800° C.) Au/Ta$_2$O$_5$/GaN devices. As the BB UV PDs functioning in high temperature conditions are fundamental optoelectronic components to support the innovative technological advancement. In this aspect the proposed post-annealed (700° C. and 800° C.) GaN based MIS type UV PD devices offering higher thermal stability as well as superior photodetection properties.

An UV photo sensing element comprising a GaN substrate is proposed, on which a Ta$_2$O$_5$ thin film layer is deposited. The Ta$_2$O$_5$/GaN thin film layered stack receives and converts UV light having a wavelength that lies between 210-380 nm into electrical signal as an output in the photovoltaic mode (at 0 V). Symmetric Au-interdigitated electrodes formed on the Ta$_2$O$_5$/GaN stack is designed to collect the photovoltaic output. To collect the electrical signal in photovoltaic mode operation without using neutral density filters, components such as resistors or amplifiers, have not been employed in the measuring system/circuit.

In accordance with the present invention—Au/Ta$_2$O$_5$/GaN MIS UV broadband (210-380 nm) PD devices operated at zero volts i.e., in photovoltaic mode are fabricated and tested. In general, GaN based metal-semiconductor-metal (MSM) type UV PD devices are simple to fabricate and functions in UV-A (320-400 nm) region only due to its band edge of ~3.4 eV. Due to this fact, a high-k dielectric oxide layer is introduced at the Au/GaN interface using e-beam evaporation technique. The resulting device in the post-annealed conditions show BB photoresponsivity which covers the UV-C, UV-B and UV-A regions i.e., from 210 nm to 380 nm. This improvement in the broad spectral response is ascribed to the exclusion of multiple reflections attained with the presence of atomic clusters as evidenced from AFM analysis. The other possible reason may be owing to the improvement in the crystallinity as evidenced from XRD analysis.

At 0 V bias, the post-annealed PD devices exhibit reasonable peak responsivity of 212 mA/W, EQE of 86.8%, detectivity of 1.5×10$^{13}$ Jones and faster rise/fall times of 90/790 ms as illustrated in FIGS. 7A-7C and FIGS. 10A-10F. To guarantee the superior photosensitivity of the annealed UV PD devices, the transmittance of the illuminated UV light is reduced using neutral density filters ND1 and ND2. The fabricated post-annealed PD devices responds at an external bias of 3 V and exhibits reasonable responsivity with reproducibility as indicated in FIGS. 9A-9F, FIGS. 11A-11D and FIGS. 12A-12D.

The present invention deals with the formation of crystalline Ta$_2$O$_5$ thin films using a simple e-beam evaporation approach and the impact of the post-annealing process on photodetection parameters of the fabricated Au/Ta$_2$O$_5$/GaN MIS type heterojunction UV PD device operating at 0 V. The influence of post-annealing process on the optical/structural characteristics are examined with UV-VIS, XRD, AFM and XPS techniques. The assessed admirable transmittance value of 99.6% from the 800° C. post-annealed Ta$_2$O$_5$/quartz stack indicates that almost all the incident UV-A light is transmitted through Ta$_2$O$_5$ film and reaches the underlying GaN semiconductor. XRD and AFM analysis indicates that the post-annealed Ta$_2$O$_5$ films exhibit an orthorhombic phase and surface morphology comprised of atomic clusters. At 0 V bias, the 800° C. post-annealed MIS PD device exhibits peak responsivity of 212 mA/W, EQE of 86.8%, detectivity of 1.5×10$^{13}$ Jones and rise/fall times of 90 ms and 790 ms, respectively. The structural and photodetection parameter results indicate that the post-annealed Ta$_2$O$_5$ crystalline film in association with GaN may emerge as a future fundamental basic building block and serve as a superior UV PD device in the optoelectronic field due to the optimal performance noted in I-V, photoresponsivity, EQE, detectivity and I-t measurements.

The present invention is focused on the preparation of symmetric interdigitated Au electrodes on Ta$_2$O$_5$/GaN heterojunction and to check its functioning as a photosensor in UV-C to A region. The impact of post-annealing procedure on the bandgap, crystalline quality, surface morphology and chemical composition is investigated using UV-VIS, XRD, AFM and XPS techniques, respectively. A simple cost-effective e-beam evaporation method is proposed for depositing Ta$_2$O$_5$ and Au films compared to ALD/PLD techniques. The functioning of post-annealed PD devices at an external bias of 3 V is reported, even if the transmittance/optical powers of the incident UV light are reduced using neutral density filters such as ND1 and ND2. Al$_2$O$_3$/undoped-GaN/Si-doped n-GaN heterostructure is used in which Si-doped n-GaN is functioned as UV light sensing material and undoped GaN as buffer layer between Si-doped n-GaN and Al$_2$O$_3$ (sapphire). The proposed structure is MIS configuration (Au/Ta$_2$O$_5$/GaN).

Photodetection parameters of the fabricated Au/Ta$_2$O$_5$/GaN MIS BB PDs are studied using I-V, responsivity and temporal responses as a function of the post-annealing process. At 0 V bias, with the illumination of 350 nm UV light, the 800° C. post-annealed MIS PD device exhibit peak responsivity of 212 mA/W, EQE of 86.8% and detectivity of 1.5×10$^{13}$ Jones compared with the as-deposited PD device. This remarkable improvement in the photodetection performance is attributed to the best band configuration of the Ta$_2$O$_5$/GaN heterostructure because of substantial post-annealing process and facilitating broadband absorption from UV-C to A region with quicker generation, separation and transportation of photogenerated charge carriers using a single device.

Fabricated and reported ultraviolet photodetector device exhibited remarkable stability in current versus time (I-t) plot for continuous ON/OFF of 4 cycles of UV light illumination upon the device measured at 0V (without external bias). Further, at 3V bias, the same stability is noticed during ON/OFF states of UV light illumination upon Au/Ta$_2$O$_5$/n-GaN PD device even the illuminated optical power was reduced using ND1(10% of transmission) and ND2 (1% of transmission) filters (I-t measurements). Under self-driven mode (at 0 V) with 350 nm light illumination, the proposed 800° C. post-annealed MIS UV PD device generated faster rise (growth) and fall (decay) times of 90 ms and 790 ms, respectively. These results clearly demonstrate that the growth/decay times, responsivity and detectivity values are superior.

Many changes, modifications, variations and other uses and applications of the subject invention will become apparent to those skilled in the art after considering this specification and the accompanying drawings, which disclose the preferred embodiments thereof. All such changes, modifications, variations and other uses and applications, which do not depart from the spirit and scope of the invention, are deemed to be covered by the invention, which is to be limited only by the claims, which follow.

The invention claimed is:
1. A method of fabrication of an ultraviolet (UV) photodetector (PD) device, the method comprising the steps of:
   a. growing a silicon-doped n-GaN epitaxial layer on an un-doped GaN/sapphire sample to form a n-GaN sample;
   b. cleaning the n-GaN epitaxial layer of the n-GaN sample to remove surface oxides;
   c. pelletizing and depositing tantalum pentoxide (Ta$_2$O$_5$) powder on the n-GaN sample to form an Ta$_2$O$_5$/GaN stack comprising a Ta$_2$O$_5$ film;
   d. post-annealing the formed Ta$_2$O$_5$/GaN stack; and
   e. depositing high purity Au on the Ta$_2$O$_5$/GaN stack to form the ultraviolet (UV) photodetector (PD) device.
2. The method of claim 1, wherein the silicon-doped GaN epitaxial layer has a thickness of 4.5 μm.
3. The method of claim 1, wherein growing the silicon-doped n-GaN epitaxial layer on the un-doped GaN/sapphire sample is performed via a metal organic chemical vapor deposition (MOCVD) technique.

4. The method of claim 1, wherein the n-GaN sample is loaded into an electron beam evaporation system after cleaning.

5. The method of claim 1, wherein the tantalum pentoxide ($Ta_2O_5$) powder has a purity of 99%.

6. The method of claim 1, wherein the tantalum pentoxide ($Ta_2O_5$) powder is deposited with a thickness of 45 nm on the n-GaN sample.

7. The method of claim 1, wherein post-annealing the formed $Ta_2O_5$/GaN stack is done-performed at a temperature from 600° C. to 900° C. for 1 hour in air.

8. The method of claim 1, wherein 50 nm of the high purity Au is deposited on the $Ta_2O_5$/GaN stack using a photolithography interdigitated mask with an area of 6 $mm^2$.

9. The method of claim 1, further comprising measuring a thickness for each of the deposited tantalum pentoxide ($Ta_2O_5$) powder and the high purity Au using a quartz crystal microbalance.

10. The method of claim 1, further comprising transmitting illuminated light through neutral density filters to the ultraviolet (UV) photodetector (PD) device to measure photosensitivity of the ultraviolet (UV) photodetector (PD) device.

11. The method of claim 1, wherein the tantalum pentoxide ($Ta_2O_5$) powder is deposited on the n-GaN sample at a temperature from 700° C. to 800° C.

12. The method of claim 1, wherein the ultraviolet (UV) photodetector (PD) device is an Au/$Ta_2O_5$/GaN ultraviolet (UV) photodetector (PD) device.

13. The method of claim 1, wherein the ultraviolet (UV) photodetector (PD) device is a heterojunction ultraviolet (UV) photodetector (PD) device.

14. The method of claim 1, wherein the ultraviolet (UV) photodetector (PD) device is responsive to illumination at a bias of 0 volts.

* * * * *

UNITED STATES PATENT AND TRADEMARK OFFICE
CERTIFICATE OF CORRECTION

PATENT NO. : 12,268,033 B1
APPLICATION NO. : 18/640734
DATED : April 1, 2025
INVENTOR(S) : Sangaraju et al.

Page 1 of 1

It is certified that error appears in the above-identified patent and that said Letters Patent is hereby corrected as shown below:

On the Title Page

Item (72), the second inventor information "Nanda Kumar Reddy Nallabala, Al Ain (AE)" should be --Nanda Kumar Reddy Nallabala, Madanapalle (IN)--

Signed and Sealed this
Twentieth Day of May, 2025

Coke Morgan Stewart
*Acting Director of the United States Patent and Trademark Office*